(12) United States Patent
Beppu et al.

(10) Patent No.: US 11,728,771 B2
(45) Date of Patent: Aug. 15, 2023

(54) CIRCUIT APPARATUS AND OSCILLATOR

(71) Applicant: Seiko Epson Corporation, Tokyo (JP)

(72) Inventors: Kohei Beppu, Minowa (JP); Takehiro Yamamoto, Matsumoto (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/732,902

(22) Filed: Apr. 29, 2022

(65) Prior Publication Data
US 2022/0352850 A1 Nov. 3, 2022

(30) Foreign Application Priority Data
Apr. 30, 2021 (JP) .................................. 2021-077277

(51) Int. Cl.
| | |
|---|---|
| *H03B 5/32* | (2006.01) |
| *H03K 3/03* | (2006.01) |
| *G06F 1/04* | (2006.01) |
| *H03B 5/36* | (2006.01) |

(52) U.S. Cl.
CPC .............. *H03B 5/323* (2013.01); *G06F 1/04* (2013.01); *H03B 5/364* (2013.01); *H03K 3/03* (2013.01)

(58) Field of Classification Search
CPC .... G06F 1/04; H03B 5/30; H03B 5/32; H03B 5/323; H03B 5/36; H03B 5/362; H03B 5/364; H03B 5/366; H03B 5/368; H03B 2200/0034; H03B 2200/0064
See application file for complete search history.

(56) References Cited

U.S. PATENT DOCUMENTS

| | | | | |
|---|---|---|---|---|
| 7,564,317 | B2 * | 7/2009 | Ker .......................... | H03B 5/36 331/158 |
| 2006/0244546 | A1 * | 11/2006 | Yamamoto ............... | H03B 5/04 331/158 |
| 2010/0225403 | A1 * | 9/2010 | Boroditsky ............ | H03B 5/364 331/55 |
| 2014/0300423 | A1 * | 10/2014 | Moon ...................... | H03B 5/36 331/105 |
| 2018/0108627 | A1 * | 4/2018 | Yamamoto .......... | H01L 27/0251 |
| 2018/0254742 | A1 * | 9/2018 | Akhavan ................ | H03B 5/362 |
| 2019/0006992 | A1 * | 1/2019 | Marques ................ | H03B 5/366 |
| 2022/0329204 | A1 * | 10/2022 | Nakanishi .............. | H03H 11/04 |

FOREIGN PATENT DOCUMENTS

| | | | | |
|---|---|---|---|---|
| JP | 5622120 B2 * | 11/2014 | ............... | H03B 5/32 |
| JP | 2015-073246 A | 4/2015 | | |
| JP | 5772109 B2 * | 9/2015 | ............... | H03B 5/32 |

\* cited by examiner

*Primary Examiner* — Levi Gannon
(74) *Attorney, Agent, or Firm* — Harness, Dickey & Pierce, P.L.C.

(57) ABSTRACT

A circuit apparatus includes an oscillation circuit that generates an oscillation signal, a first buffer circuit that outputs a first clock signal based on the oscillation signal, a second buffer circuit that outputs a second clock signal based on the first clock signal, a first terminal electrically couplable to a first node via which the first buffer circuit outputs the first clock signal, and a second terminal electrically coupled to a second node via which the second buffer circuit outputs the second clock signal, and the rise period of the first clock signal is shorter than the rise period of the second clock signal.

9 Claims, 13 Drawing Sheets

CIRCUIT APPARATUS AND OSCILLATOR

The present application is based on, and claims priority from JP Application Serial Number 2021-077277, filed Apr. 30, 2021, the disclosure of which is hereby incorporated by reference herein in its entirety.

BACKGROUND

1. Technical Field

The present disclosure relates to a circuit apparatus and an oscillator.

2. Related Art

JP-A-2015-073246 describes an oscillation circuit in which an inversion circuit causes a quartz crystal resonator to resonate, the output signal of the inversion circuit is inputted to a plurality of inversion buffers, a clock signal is outputted from the final-stage inversion buffer, a low-pass filter is used to average the duty ratios of the clock signal, and feedback control is so performed that the duty ratio of the clock signal is maintained at 50% based on the analog value of the averaged duty ratio.

In general, as in the oscillation circuit described in JP-A-2015-073246, since the clock signal outputted from the final-stage buffer is outputted out of the oscillation circuit via an external coupling terminal, the clock signal has long rise and fall periods in some cases when a large load is coupled to the external coupling terminal. Furthermore, to reduce EMI noise, the clock signal outputted via the external coupling terminal has a waveform having intentionally long rise and fall periods in some cases. The clock signal having long rise and fall periods has a waveform distorted with respect to a rectangular waveform, resulting in complicated correlation between the DC voltage smoothened by a low-pass filter and the duty ratio. It is therefore difficult to accurately calculate the duty ratio of the clock signal outputted via the external coupling terminal based on the smoothened DC voltage of the clock signal.

SUMMARY

A circuit apparatus according to an aspect of the present disclosure includes an oscillation circuit that generates an oscillation signal, a first buffer circuit that outputs a first clock signal based on the oscillation signal, a second buffer circuit that outputs a second clock signal based on the first clock signal, a first terminal electrically couplable to a first node via which the first buffer circuit outputs the first clock signal, and a second terminal electrically coupled to a second node via which the second buffer circuit outputs the second clock signal, and a rise period of the first clock signal is shorter than a rise period of the second clock signal.

An oscillator according to another aspect of the present disclosure includes the circuit apparatus according to the aspect and a resonator.

DESCRIPTION OF EXEMPLARY EMBODIMENTS

Preferable embodiments of the present disclosure will be described below in detail with reference to the drawings. It is not intended that the embodiments described below unduly limit the contents of the present disclosure described in the claims. Furthermore, all configurations described below are not necessarily essential configuration requirements of the present disclosure.

1. First Embodiment 1-1. Configuration of Oscillator

Figure 1:
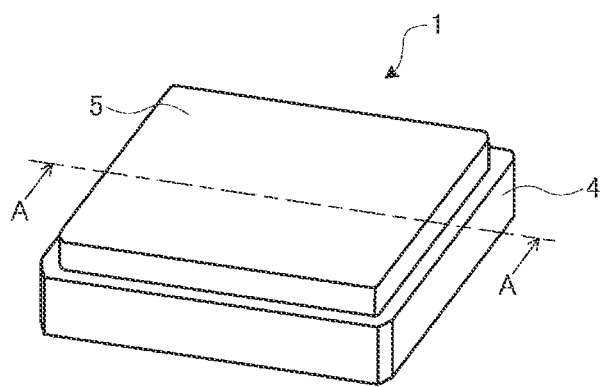
FIG. 1 is a perspective view of an oscillator according to an embodiment of the present disclosure.
Figure 2:
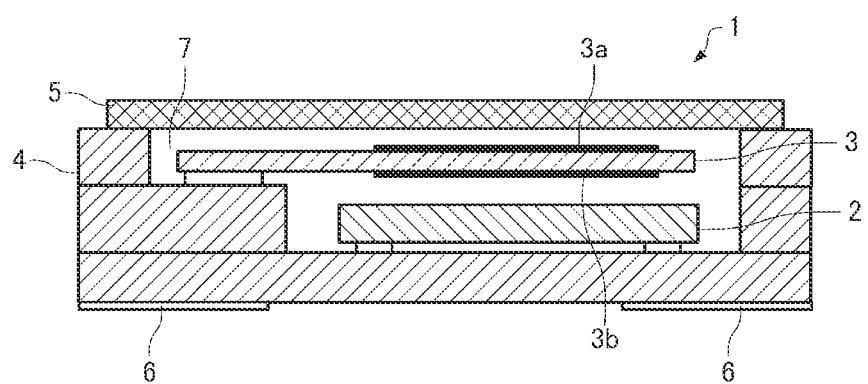
FIG. 2 is a cross-sectional view of the oscillator according to the embodiment.

FIGS. 1 and 2 show an example of the structure of an oscillator 1 according to the present embodiment. FIG. 1 is a perspective view of the oscillator 1, and FIG. 2 is a cross-sectional view taken along the line AA in FIG. 1.

The oscillator 1 includes a circuit apparatus 2, a resonator 3, a package 4, a lid 5, and a plurality of external terminals 6, as shown in FIGS. 1 and 2. In the present embodiment, the resonator 3 is a quartz crystal resonator using quartz crystal as a substrate material and is, for example, an AT-cut quartz crystal resonator or a tuning-fork-shaped quartz crystal resonator. The resonator 3 may be a SAW (surface acoustic wave) resonator or a MEMS (micro electro mechanical systems) resonator. The substrate material of the resonator 3 can, in addition to quartz crystal, for example, be a piezoelectric material, including piezoelectric single crystals, such as lithium tantalate and lithium niobate, and piezoelectric ceramics, such as lead zirconate titanate, or a silicon semiconductor material. To excite the resonator 3, a component based on the piezoelectric effect or a component electrostatically driven by Coulomb force may be used. In the present embodiment, the circuit apparatus 2 is realized by a one-chip integrated circuit (IC). It is, however, noted that at least part of the circuit apparatus 2 may be formed of discrete parts.

The package 4 accommodates the circuit apparatus 2 and the resonator 3 in the same space. Specifically, the package 4 is provided with a recess, and the recess is covered with the lid 5 to form an accommodation chamber 7. The interior of the package 4 or on the surface of the recess is provided with wiring that is not shown but electrically couples two terminals of the circuit apparatus 2, specifically, terminals XI and XO shown in FIG. 3, which will be described later, to two excitation electrodes 3$a$ and 3$b$ of the resonator 3, respectively. The interior of the package 4 or on the surface of the recess is further provided with wiring that is not shown but electrically couples the terminals of the circuit apparatus 2 to the external terminals 6 provided at the bottom surface of the package 4. The package 4 does not necessarily have the configuration in which the circuit apparatus 2 and the resonator 3 are accommodated in the same space. For example, the package 4 may be what is called an H-shaped package in which the circuit apparatus 2 is mounted on one surface of the substrate of the package and the resonator 3 is mounted on the other surface of the substrate.

The resonator 3 includes metal excitation electrodes 3$a$ and 3$b$ at front and rear surfaces thereof, respectively, and oscillates at a desired frequency according to the shape and mass of the resonator 3 including the excitation electrodes 3$a$ and 3$b$.

Figure 3:
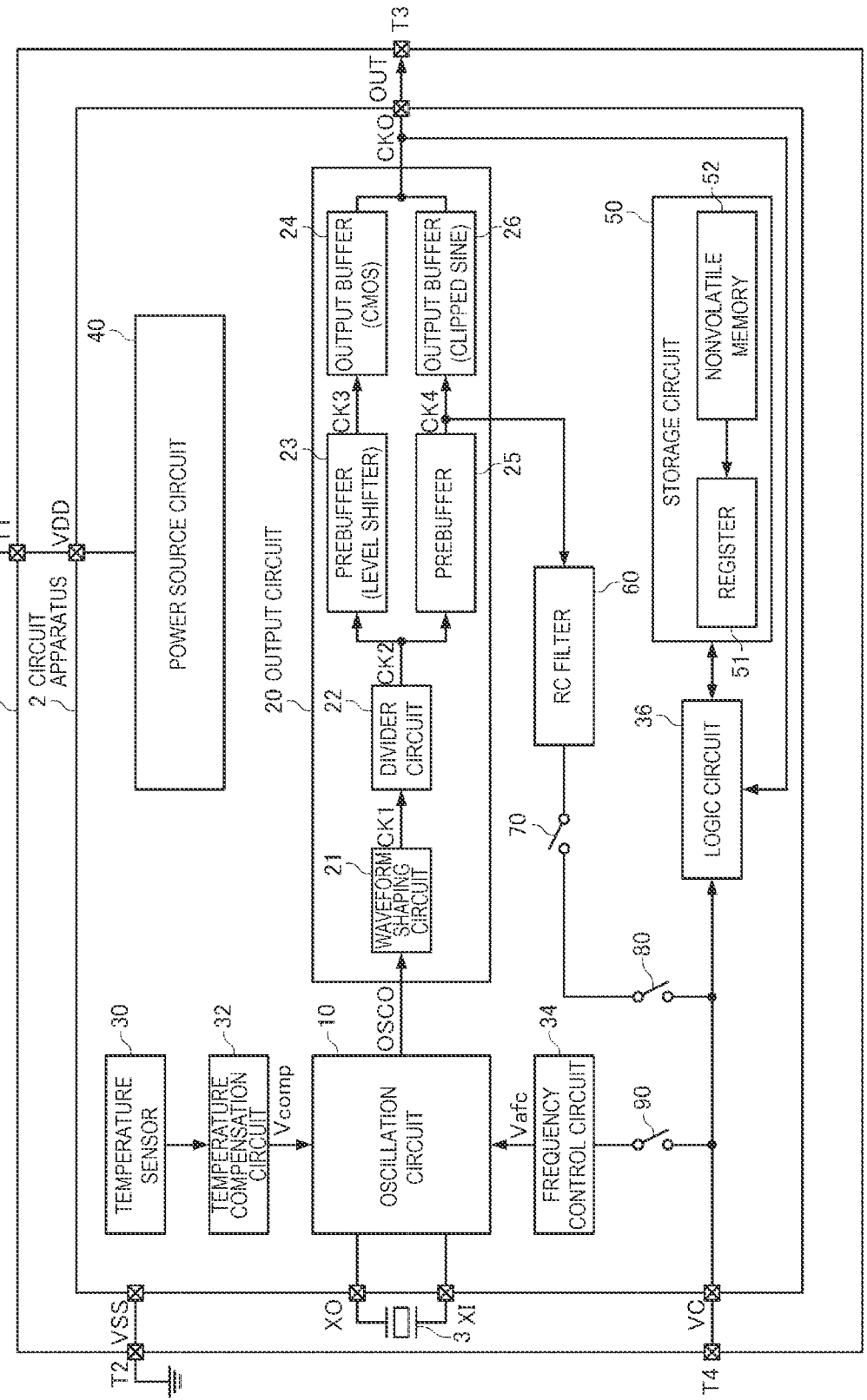
FIG. 3 is a functional block diagram of the oscillator according to a first embodiment.

FIG. 3 is a functional block diagram of the oscillator 1 according to the first embodiment. The oscillator 1 according to the present embodiment includes the circuit apparatus 2 and the resonator 3, as shown in FIG. 3. The circuit apparatus 2 includes terminals VDD, VSS, OUT, VC, XI, and XO as external coupling terminals. The terminals VDD, VSS, OUT, and VC are electrically coupled to terminals T1, T2, T3, and T4, respectively, which are the plurality of external terminals 6 of the oscillator 1 shown in FIG. 2. The terminal XI is electrically coupled to one end of the resonator 3, and the terminal XO is electrically coupled to the other end of the resonator 3.

In the present embodiment, the circuit apparatus 2 includes an oscillation circuit 10, an output circuit 20, a temperature sensor 30, a temperature compensation circuit 32, a frequency control circuit 34, a logic circuit 36, a power source circuit 40, a storage circuit 50, an RC filter 60, and switch circuits 70, 80, and 90. The circuit apparatus 2 may instead have a configuration in which part of the elements described above is omitted or changed or a configuration in which other elements are added to the elements described above.

The power source circuit 40 generates a variety of constant voltages based on a power source voltage externally supplied via the terminals T1 and VDD and supplies the circuits with the generated voltages. For example, the power source circuit 40 may include a plurality of regulators that produce the constant voltages based on an output voltage from a bandgap reference circuit.

The oscillation circuit 10 is electrically coupled to the terminals XI and XO and causes the resonator 3 to oscillate to generate an oscillation signal OSCO. Specifically, the oscillation circuit 10 receives a signal outputted from the resonator 3 via the terminal XI, amplifies the signal, and supplies the resonator 3 with the amplified signal via the terminal XO.

The temperature sensor 30 detects the temperature of the circuit apparatus 2, outputs a temperature signal carrying a voltage corresponding to the temperature, and is realized, for example, by a circuit utilizing temperature characteristics of the bandgap reference circuit.

The temperature compensation circuit 32 generates a temperature compensation voltage Vcomp, which corrects the frequency-temperature characteristics of the oscillation signal OSCO to be outputted from the oscillation circuit 10, based on the temperature signal outputted from the temperature sensor 30 and temperature compensation data corresponding to the frequency-temperature characteristics of the resonator 3 and supplies the oscillation circuit 10 with the temperature compensation voltage Vcomp. The temperature compensation data is supplied from the logic circuit 36 to the temperature compensation circuit 32.

The frequency control circuit 34 receives a frequency control signal inputted from the terminal T4 via the terminal VC when the switch circuit 90 is closed. The frequency control circuit 34 then generates a frequency control voltage Vafc for controlling the oscillation frequency of the oscillation circuit 10 in accordance with the voltage level of the frequency control signal, and supplies the oscillation circuit 10 with the frequency control voltage Vafc.

The temperature compensation voltage Vcomp causes the oscillation signal OSCO outputted by the oscillation circuit 10 to have a substantially constant frequency according to the frequency control voltage Vafc at any temperature within a predetermined temperature range. The oscillation signal OSCO is inputted to the output circuit 20.

In the present embodiment, the output circuit 20 includes a waveform shaping circuit 21, a divider circuit 22, a prebuffer 23, an output buffer 24, a prebuffer 25, and an output buffer 26.

The waveform shaping circuit 21 buffers the oscillation signal OSCO outputted from the oscillation circuit 10 and outputs a rectangular-wave clock signal CK1.

The divider circuit 22 divides the clock signal CK1 outputted from the waveform shaping circuit 21 by using a division ratio according to division ratio data to generate a clock signal CK2 and outputs the clock signal CK2. The division ratio data is supplied from the logic circuit 36 to the divider circuit 22. When the division ratio is 1, the divider circuit 22 outputs the clock signal CK2 that is the buffered clock signal CK1 outputted from the waveform shaping circuit 21. The clock signal CK2 outputted from the divider circuit 22 is equally inputted to the prebuffers 23 and 25.

The prebuffer 23 buffers the clock signal CK2 outputted from the divider circuit 22 and outputs a clock signal CK3, which is the buffered clock signal CK2. The prebuffer 23 also functions as a level shifter that outputs the clock signal CK3 having a voltage level matched to the level of the voltage to be inputted to the output buffer 24.

The output buffer 24 buffers the clock signal CK3 outputted from the prebuffer 23 and outputs a clock signal having a CMOS (complementary metal oxide semiconductor) output waveform.

The prebuffer 25 buffers the clock signal CK2 outputted from the divider circuit 22 and outputs a clock signal CK4, which is the buffered clock signal CK2.

The output buffer 26 converts the clock signal CK4 outputted from the prebuffer 25 into a clock signal having a clipped sinusoidal waveform and outputs the converted clock signal.

In the present embodiment, the output node of the output buffer 24 and the output node of the output buffer 26 are electrically coupled to the terminal OUT. At least one of the output node of the output buffer 24 and the output node of the output buffer 26 has high impedance in accordance with clock selection data. The clock selection data is supplied from the logic circuit 36 to the output buffers 24 and 26.

When only the output node of the output buffer 26 has high impedance, the clock signal having the CMOS output waveform and outputted from the output buffer 24 is outputted as a clock signal CKO out of the oscillator 1 via the terminals OUT and T3. When only the output node of the output buffer 24 has high impedance, the clock signal having the clipped sinusoidal waveform and outputted from the output buffer 26 is outputted as the clock signal CKO out of the oscillator 1 via the terminals OUT and T3.

The RC filter 60 receives the clock signal CK4 outputted from the prebuffer 25, smoothens the voltage of the clock signal CK4, and outputs a DC voltage that is the smoothened voltage.

The switch circuits 70, 80, and 90 are each closed or opened in accordance with switch control data. The switch control data is supplied from the logic circuit 36 to the switch circuits 70, 80, and 90.

When the switch circuit 70 is closed, the RC filter is electrically continuous with one end of the switch circuit 80, whereas when the switch circuit 70 is open, the RC filter 60 is not electrically continuous with the one end of the switch circuit 80.

When the switch circuit 80 is closed, one end of the switch circuit 70 is electrically continuous with the terminal VC, whereas when the switch circuit 80 is open, the one end of the switch circuit 70 is not electrically continuous with the terminal VC.

When the switch circuit 90 is closed, the terminal VC is electrically continuous with the input node of the frequency control circuit 34, whereas when the switch circuit 90 is open, the terminal VC is not electrically continuous with the input node of the frequency control circuit 34.

The logic circuit 36 controls the operation of each of the circuits. Specifically, the logic circuit 36 sets one of a plurality of modes, including an external communication mode, a normal operation mode, and a variety of inspection modes as the operation mode of the oscillator 1 or the circuit apparatus 2, based on a control signal inputted to a terminal of the circuit apparatus 2, and performs control according to the set operation mode. In the present embodiment, when a control signal having a predetermined pattern is inputted via the terminal VC within a predetermined period after the supply of the power source voltage to the terminal VDD starts, the logic circuit 36 sets the external communication mode as the operation mode after the predetermined period elapses. For example, the logic circuit 36 may regard, as the predetermined period, the period from the timing when the resonator 3 starts oscillating in response to the supplied power source voltage to the timing when stabilized oscillation of the resonator 3 is detected, or the logic circuit 36 may count the number of pulses of the oscillation signal OSCO and determine that the predetermined period has elapsed when the count reaches a predetermined value. The logic circuit 36 may instead, for example, measure the predetermined period based on an output signal from an RC time constant circuit that starts operating in response to the supplied power source voltage.

In the external communication mode, the logic circuit 36 outputs clock selection data that sets the outputs from the output buffers 24 and 26 both at high impedance, and further outputs switch control data that opens all the switch circuits 70, 80, and 90. In the external communication mode, a serial clock signal and a serial data signal are inputted via the terminals VC and OUT in synchronization with each other. In the external communication mode, the logic circuit 36 samples the serial data signal at every edge of the serial clock signal in accordance, for example, with the I²C (inter-integrated circuit) bus standard. The logic circuit 36 then sets the operation mode, sets the clock selection data and the switch control data in each operation mode, reads and writes data from and to a register 51 or a nonvolatile memory 52 based on the sampled commands and data, and carries out other processes. In the present embodiment, the logic circuit 36 functions as an interface circuit for a two-wire bus, such as an I²C (inter-integrated circuit) bus, and may instead function as an interface circuit for a three-wire or four-wire bus, such as an SPI (serial peripheral interface) bus.

For example, when the logic circuit 36 samples a normal operation mode setting command in the external communication mode, the logic circuit 36 changes the operation mode from the external communication mode to the normal operation mode. In the normal operation mode, the logic circuit 36 outputs clock selection data that sets only one of the outputs from the output buffers 24 and 26 at high impedance, and further outputs switch control data that opens the switch circuits 70 and 80 and closes the switch circuit 90. Therefore, the terminal VC and the RC filter 60 are electrically decoupled from each other, and the terminal VC and the frequency control circuit 34 are electrically coupled to each other. As a result, the clock signal CKO having a frequency corresponding to the voltage at the terminal VC is outputted from the terminal OUT and exits out of the oscillator 1 via the terminal T3.

When no control signal having a predetermined pattern is inputted via the terminal VC within the predetermined period after the supply of the power source voltage starts, the logic circuit 36 does not set the external communication mode after the predetermined period elapses but directly sets the normal operation mode as the operation mode.

For example, when the logic circuit 36 samples a duty ratio inspection command in the external communication mode, the logic circuit 36 changes the operation mode from the external communication mode to a duty ratio inspection mode, which is one of the inspection modes. In the duty ratio inspection mode, the logic circuit 36 outputs switch control data that closes the switch circuits 70 and 80 and opens the switch circuit 90. Therefore, the terminal VC and the RC filter 60 are electrically coupled to each other, and the terminal VC and the input node of frequency control circuit 34 are electrically decoupled from each other. As a result, the DC voltage outputted from the RC filter 60 is outputted via the terminal VC and exits out of the oscillator 1 from the terminal T4, and an external apparatus can calculate the duty ratio of the clock signal CK4 based on the voltage at the terminal T4.

The storage circuit 50 is a circuit that stores a variety of pieces of information and includes the register 51 and the nonvolatile memory 52. The nonvolatile memory 52 is, for example, a MONOS (metal oxide nitride oxide silicon) memory or an EEPROM (electrically erasable programmable read-only memory). In the step of manufacturing the oscillator 1, a variety of pieces of information, such as the temperature compensation data, the division ratio data, and the clock selection data, are stored in the nonvolatile memory 52. When the oscillator 1 is powered on, the variety of pieces of information stored in the nonvolatile memory 52 are transferred to the register 51, and the variety of pieces of information saved in the register 51 are supplied to each of the circuits as appropriate via the logic circuit 36.

1-2. Configuration of Oscillator Circuit

Figure 4:
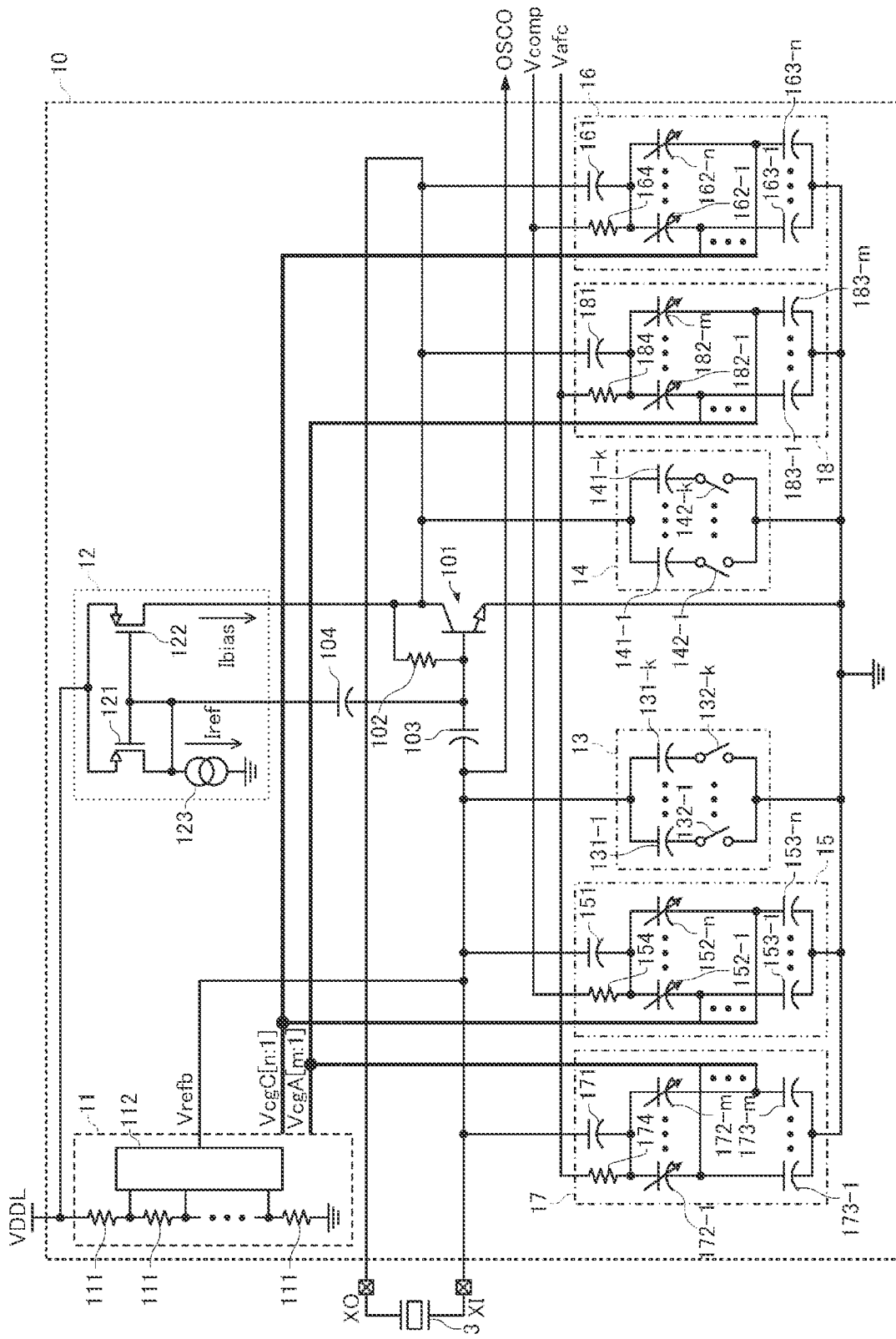
FIG. 4 shows an example of the configuration of an oscillation circuit.

FIG. 4 shows an example of the configuration of the oscillation circuit 10. The oscillation circuit 10 includes a reference voltage circuit 11, a bias current generation circuit 12, capacitance circuits 13 and 14, variable capacitance circuits 15, 16, 17, and 18, a bipolar transistor 101, a resistive element 102, and capacitive elements 103 and 104, as shown in FIG. 4. The oscillation circuit 10 in the present embodiment may instead have a configuration in which part of the elements described above is omitted or changed or other elements are added to the elements described above.

The reference voltage circuit 11 includes a plurality of resistive elements 111 and a duty ratio adjustment circuit 112. The plurality of resistive elements 111 are coupled in series to each other and disposed between a wire along which a power source voltage VDDL is supplied and the ground. The power source voltage VDDL is supplied from the power source circuit 40. The plurality of resistive elements 111 divide the voltage that is the difference between the power source voltage VDDL and the ground voltage into a plurality of voltages, and the reference voltage circuit 11 outputs at least part of the plurality of voltages as n reference voltages VcgC[n:1] and m reference voltages VcgA[m:1], where n and m are each an integer greater than or equal to 2. The integers n and m may be equal to each other or differ from each other. At least one of the n reference voltages VcgC[n:1] and at least one of the m reference voltages VcgA[m:1] may be equal to each other. The reference voltages VcgC [n:1] are supplied to the variable capacitance circuits 15 and 16. The reference voltages VcgA [m:1] are supplied to the variable capacitance circuits 17 and 18.

The duty ratio adjustment circuit 112 selects based on a duty ratio adjustment data any one of part or entirety of the plurality of voltages divided by the plurality of resistive elements 111 and outputs the selected voltage as a bias voltage Vrefb. The duty ratio adjustment data is stored in the nonvolatile memory 52, and the logic circuit 36 supplies the duty ratio adjustment circuit 112 with the duty ratio adjustment data transferred from the nonvolatile memory 52 to the register 51.

The bias current generation circuit 12 includes two P-channel-type MOS (metal oxide semiconductor) transistors 121 and 122 and a constant current source 123.

The MOS transistor 121 has a gate and a drain electrically coupled to each other and a source to which the power source voltage VDDL is supplied. The MOS transistor 122 has a gate electrically coupled to the gate of the MOS transistor 121, a source to which the power source voltage VDDL is supplied, and a drain electrically coupled to the collector of the bipolar transistor 101, which is an amplifier. The gate and drain of the MOS transistor 121 are electrically coupled to one end of the constant current source 123. The other end of the constant current source 123 is coupled to the ground.

In the thus configured bias current generation circuit 12, a reference current Iref flowing through the constant current source 123 is multiplied by a predetermined value by a current mirror circuit formed of the MOS transistors 121 and 122, and the multiplied current flows through the path between the source and the drain of the MOS transistor 122. The multiplied current is supplied as a bias current Ibias to the bipolar transistor 101.

The capacitive element 103 has one end electrically coupled to the base of the bipolar transistor 101, and another end electrically coupled to one end of the resonator 3 via the terminal XI.

The capacitive element 104 has one end electrically coupled to the gate of MOS transistor 121 and the gate of the MOS transistor 122, and another end electrically coupled to the base of the bipolar transistor 101.

The bipolar transistor 101 has a base electrically coupled to the one end of the capacitive element 103, a collector electrically coupled to the terminal XO, and an emitter that is grounded. The resistive element 102 is coupled to and disposed between the base and the collector of the bipolar transistor 101. The bias current Ibias is supplied to the collector of the bipolar transistor 101.

The oscillation signal inputted via the terminal XI is supplied to the gate of the bipolar transistor 101 via the capacitive element 103 and amplified by the bipolar transistor 101, which is an amplifier. The amplified oscillation signal is supplied from the collector of the bipolar transistor 101 to the resonator 3 via the terminal XO. As the amplifier, a MOS transistor or a CMOS inverter may be used in place of the bipolar transistor 101.

The oscillation circuit 10 outputs as the oscillation signal OSCO a signal generated at a node between the terminal XI and the other end of the capacitive element 103. The bias voltage Vrefb is supplied to the node from the duty ratio adjustment circuit 112 of the reference voltage circuit 11. The oscillation signal OSCO therefore has a waveform that oscillates around the bias voltage Vrefb, and is inputted to the waveform shaping circuit 21 of the output circuit 20. The duty ratio of the clock signal CK1 outputted from the waveform shaping circuit 21 therefore changes in accordance with the bias voltage Vrefb, resulting in a change in the duty ratio of the clock signal CKO outputted from the output circuit 20. Since the bias voltage Vrefb is a voltage according to the duty ratio adjustment data supplied from the logic circuit 36, the duty ratio of the clock signal CKO can be brought closer to a target value by setting appropriate duty ratio adjustment data in the nonvolatile memory 52. The target value is, for example, 50%.

The capacitance circuit 13 includes k capacitive elements 131-1 to 131-$k$ and k switch elements 132-1 to 132-$k$. The parameter k is an integer greater than or equal to 2. For each integer i greater than or equal to 1 but smaller than or equal to k, the capacitive element 131-$i$ has one end electrically coupled to the terminal XI, and another end electrically coupled to one end of the switch element 132-$i$. The other end of the switch element 132-$i$ is electrically coupled to the ground.

The capacitance circuit 14 includes k capacitive elements 141-1 to 141-$k$ and k switch elements 142-1 to 142-$k$. For each integer i greater than or equal to 1 but smaller than or equal to k, the capacitive element 141-$i$ has one end electrically coupled to the terminal XO, and another end electrically coupled to one end of the switch element 142-$i$. The other end of the switch element 142-$i$ is electrically coupled to the ground.

The switch elements 132-1 to 132-$k$ are closed or opened in accordance with the value of the bits of the frequency adjustment data. The capacitive element 131-$i$ is coupled to and disposed between the terminal XI and the ground when the switch element 132-$i$ is closed. Similarly, the switch elements 142-1 to 142-$k$ are closed or opened in accordance with the value of the bits of the frequency adjustment data. The capacitive element 141-$i$ is coupled to and disposed between the terminal XO and the ground and when the switch element 142-$i$ is closed. The frequency adjustment data is stored in the nonvolatile memory 52, and the logic circuit 36 supplies the capacitance circuits 13 and 14 with the frequency adjustment data transferred from the nonvolatile memory 52 to the register 51.

The capacitance value of the capacitance circuit 13 is the sum of the capacitance values of the capacitive elements coupled to and disposed between the terminal XI and the ground out of the capacitive elements 131-1 to 131-$k$. The capacitance value of the capacitance circuit 14 is the sum of the capacitance values of the capacitive elements coupled to and disposed between the terminal XO and the ground out of the capacitive elements 141-1 to 141-$k$. The capacitance values of the capacitance circuits 13 and 14 therefore change in accordance with the frequency adjustment data. The capacitance circuits 13 and 14 function as load capacitance of the resonator 3, and the frequency of the oscillation signal OSCO changes in accordance with the capacitance values of the capacitance circuits 13 and 14. As a result, the frequency of the clock signal CKO changes. The difference between the frequency of the clock signal CKO at a reference temperature and a target frequency can therefore be minimized by setting appropriate frequency adjustment data in the nonvolatile memory 52. The reference temperature may, for example, be 25° C.

The variable capacitance circuit 15 includes a capacitive element 151, n variable capacitive elements 152-1 to 152-$n$, n capacitive elements 153-1 to 153-$n$, and a resistive element 154. The capacitive element 151 has one end electrically coupled to the terminal XI, and another end electrically coupled to one end of each of the variable capacitive elements 152-1 to 152-$n$ and one end of the resistive element 154. For each integer i greater than or equal to 1 but smaller than or equal to n, the other end of the variable capacitive element 152-$i$ is electrically coupled to one end of the capacitive element 153-$i$, and the other end of the capacitive element 153-$i$ is electrically coupled to ground. The reference voltage VcgC[i] is supplied to the other end of the variable capacitive element 152-$i$ and the one end of the capacitive element 153-$i$. The temperature compensation voltage Vcomp is supplied to the one end of each of the variable capacitive elements 152-1 to 152-$n$ via the resistive element 154.

The variable capacitance circuit 16 includes a capacitive element 161, n variable capacitive elements 162-1 to 162-$n$, n capacitive elements 163-1 to 163-$n$, and a resistive element 164. The capacitive element 161 has one end electrically coupled to the terminal XO, and another end electrically coupled to one end of each of the variable capacitance elements 162-1 to 162-$n$ and one end of the resistive element 164. For each integer i greater than or equal to 1 but smaller than or equal to n, the other end of the variable capacitive element 162-$i$ is electrically coupled to one end of the capacitive element 163-$i$, and the other end of the capacitive element 163-$i$ is electrically coupled to ground. The reference voltage VcgC[i] is supplied to the other end of the variable capacitive element 162-$i$ and the one end of the capacitive element 163-$i$. The temperature compensation voltage Vcomp is supplied to the one end of each of the variable capacitive elements 162-1 to 162-$n$ via the resistive element 164.

The capacitance value of each of the variable capacitive elements 152-1 to 152-$n$ changes in accordance with the temperature compensation voltage Vcomp. Similarly, the capacitance value of each of the variable capacitive elements 162-1 to 162-$n$ changes in accordance with the temperature compensation voltage Vcomp. The capacitance values of the variable capacitance circuits 15 and 16 therefore change in accordance with the temperature compensation voltage Vcomp. The variable capacitance circuits 15 and 16 function as load capacitance of the resonator 3, and the frequency of the oscillation signal OSCO changes in accordance with the capacitance values of the variable capacitance circuits 15 and 16. As a result, the frequency of the clock signal CKO changes. The difference between the frequency of the clock signal CKO at any temperature within the predetermined temperature range and the target frequency can therefore be minimized by setting appropriate temperature compensation data in the nonvolatile memory 52.

The variable capacitance circuit 17 includes a capacitive element 171, m variable capacitive elements 172-1 to 172-$m$, m capacitive elements 173-1 to 173-$m$, and a resistive element 174. The capacitive element 171 has one end electrically coupled to the terminal XI, and another end electrically coupled to one end of each of the variable capacitive elements 172-1 to 172-$m$ and one end of the resistive element 174. For each integer i greater than or equal to 1 but smaller than or equal to m, the other end of the variable capacitive element 172-$i$ is electrically coupled to one end of the capacitive element 173-$i$, and the other end of the capacitive element 173-$i$ is electrically coupled to ground. The reference voltage VcgA[i] is supplied to the other end of the variable capacitive element 172-$i$ and the one end of the capacitive element 173-$i$. The frequency control voltage Vafc is supplied to the one end of each of the variable capacitive elements 172-1 to 172-$m$ via the resistive element 174.

The variable capacitance circuit 18 includes a capacitive element 181, m variable capacitive elements 182-1 to 182-$m$, m capacitive elements 183-1 to 183-$m$, and a resistive element 184. The capacitive element 181 has one end electrically coupled to the terminal XO, and another end electrically coupled to one end of each of the variable capacitive elements 182-1 to 182-$m$ and one end of the resistive element 184. For each integer i greater than or equal to 1 but smaller than or equal to m, the other end of the variable capacitive element 182-$i$ is electrically coupled to one end of the capacitive element 183-$i$, and the other end of the capacitive element 183-$i$ is electrically coupled to ground. The reference voltage VcgA[i] is supplied to the other end of the variable capacitive element 182-$i$ and the one end of the capacitive element 183-$i$. The frequency control voltage Vafc is supplied to the one end of each of the variable capacitive elements 182-1 to 182-$m$ via the resistive element 184.

The capacitance value of each of the variable capacitive elements 172-1 to 172-$m$ changes in accordance with the frequency control voltage Vafc. Similarly, the capacitance value of each of the variable capacitive elements 182-1 to 182-$m$ changes in accordance with the frequency control voltage Vafc. The capacitance values of the variable capacitance circuits 17 and 18 therefore change in accordance with the frequency control voltage Vafc. The variable capacitance circuits 17 and 18 function as load capacitance of the resonator 3, and the frequency of the oscillation signal OSCO changes in accordance with the capacitance values of the variable capacitance circuits 17 and 18. As a result, the frequency of the clock signal CKO changes. The frequency of the clock signal CKO can therefore be changed in accordance with the voltage applied to the terminal T4.

The capacitive elements 103, 104, 131-1 to 131-$k$, 141-1 to 141-$k$, 151, 153-1 to 153-$n$, 161, 163-1 to 163-$n$, 171, 173-1 to 173-$m$, 181, and 183-1 to 183-$m$ may each for example, be a metal-insulator-metal-type (MIM-type) capacitor having two electrodes made of metal, or a poly Insulator poly-type (PIP-type) capacitor having two electrodes made of polysilicon. The variable capacitive elements 152-1 to 152-n, 162-1 to 162-n, 172-1 to 172-m, 182-1 to 182-m may each, for example, be a varactor in which the source and drain of a MOS transistor is coupled to each other.

1-3. Method for Inspecting Duty Ratio

In the present embodiment, the duty ratio of the clock signal CKO can be brought closer to the target value by setting appropriate duty ratio adjustment data in the non-volatile memory 52, as described above. To calculate the appropriate duty ratio adjustment data, for example, it is necessary to determine the duty ratio of the clock signal CKO in the state in which the duty ratio adjustment data is set at an initial value.

Figure 5:
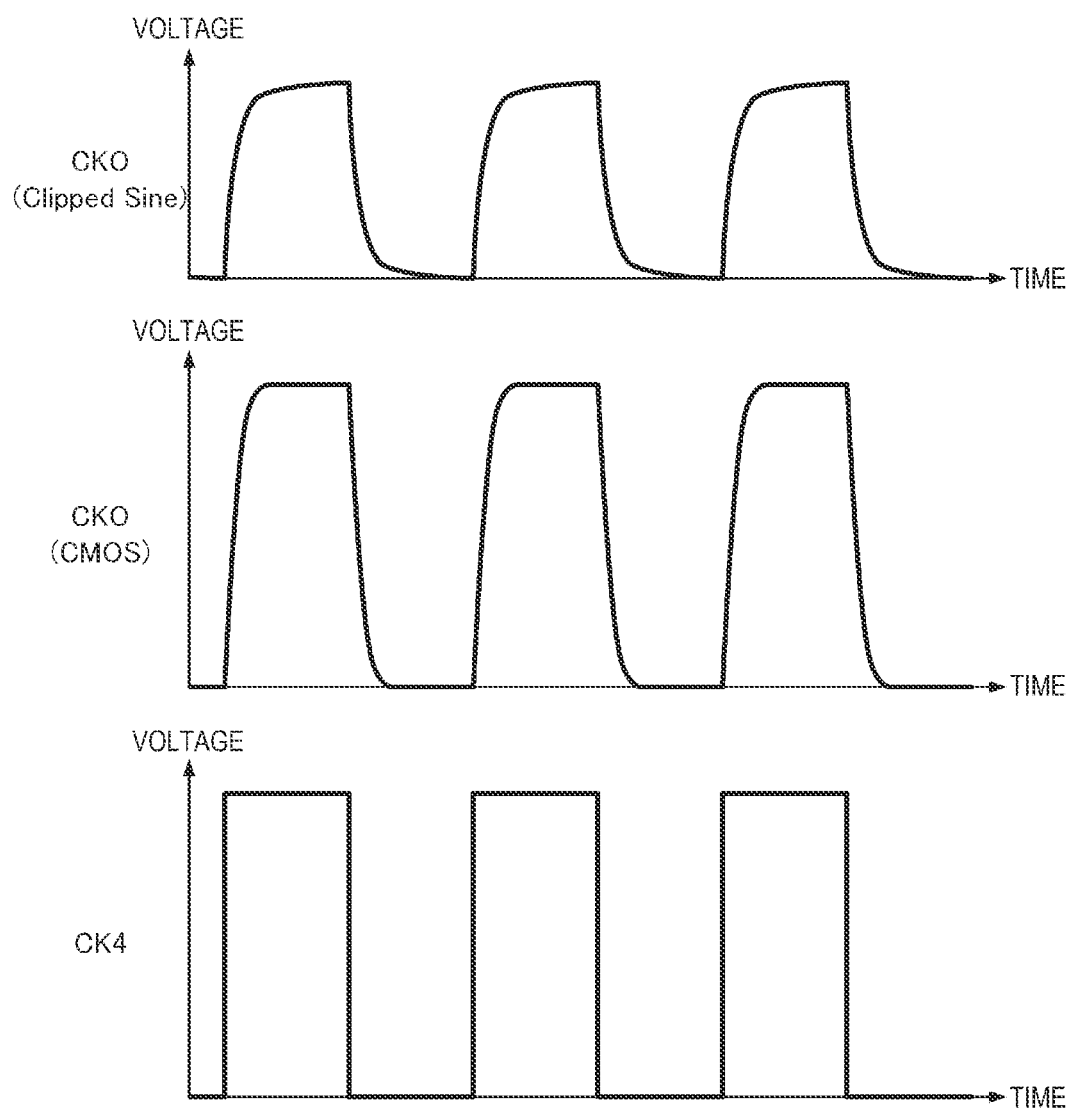
FIG. 5 shows an example of the voltage waveforms of clock signals CKO and CK4.
Figure 6:
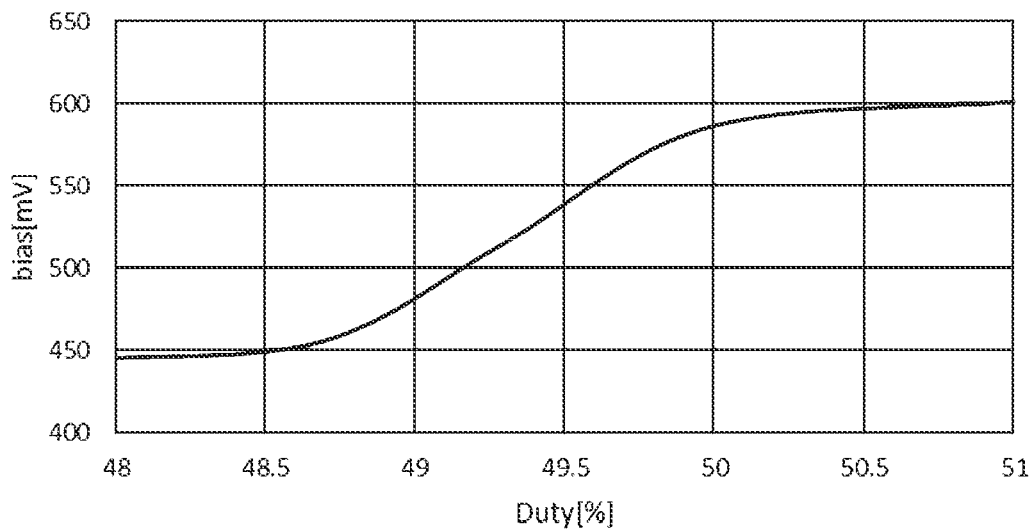
FIG. 6 shows an example of the relationship between the duty ratio and a DC bias of the clock signal CKO.
Figure 7:
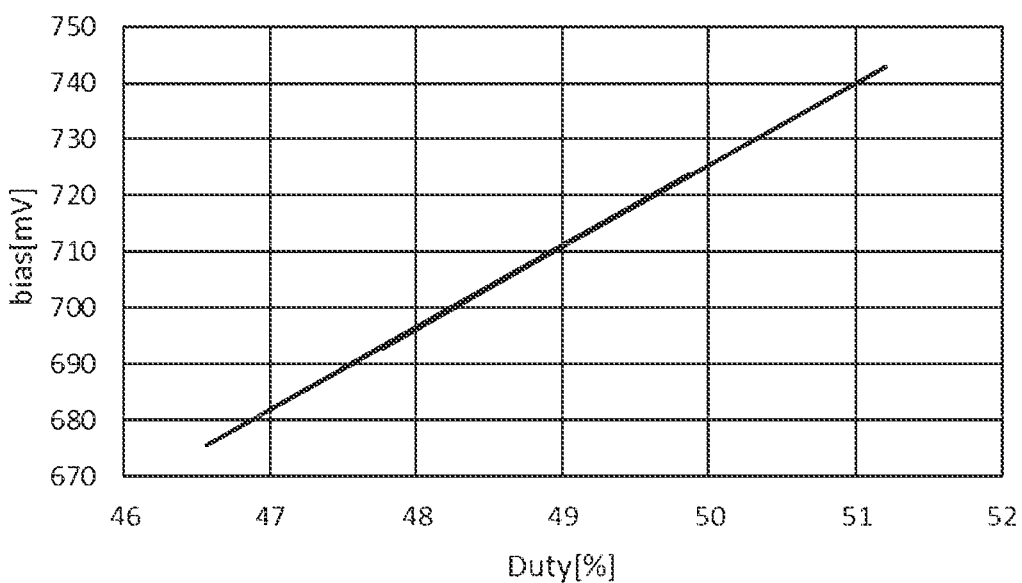
FIG. 7 shows an example of the relationship between the duty ratio and the DC bias of the clock signal CK4.

FIG. 5 shows an example of the voltage waveforms of the clock signal CKO outputted via the terminal T3 and the clock signal CK4 outputted from the prebuffer 25. In the example shown in FIG. 5, the clock signals CKO and CK4 both have a waveform having a duty ratio of 50%. FIG. 6 shows an example of the relationship between the duty ratio and a DC bias of the clock signal CKO, and FIG. 7 shows an example of the relationship between the duty ratio and the DC bias of the clock signal CK4. The DC bias is the average of the voltages of each of the clock signals, and the DC bias of the clock signal CK4 corresponds to the DC voltage outputted from the RC filter 60. The DC bias of the clock signal CKO corresponds to the DC voltage outputted from the RC filter if the RC filter is coupled to the terminal T3.

The clock signal CKO outputted from the output buffer 26 is a signal having a clipped sinusoidal waveform, as described above. The clock signal CKO having a clipped sinusoidal waveform has gentle rise and fall waveform edges, as shown in FIG. 5. The clock signal CKO outputted from the output buffer 24 is a signal having a CMOS output waveform, as described above. However, when an external circuit coupled to the terminal T3 has a large load, the clock signal CKO having a CMOS output waveform has gentle rise and fall waveform edge. The oscillation amplitude of the clock signal CKO outputted via the terminal T3 therefore greatly fluctuates. As a result, the duty ratio of the clock signal CKO and the DC bias do not have a linear relationship, as shown in FIG. 6, and it is difficult to accurately calculate the duty ratio from the DC bias.

On the other hand, in the present embodiment, the prebuffer 25 drives the output buffer 26 and the RC filter 60 each having a small load, and has a driving capability higher than that of the waveform shaping circuit 21. The clock signal CK4 outputted from the prebuffer 25 therefore has a rectangular waveform, so that the rise period of the clock signal CK4 is shorter than the rise period of clock signal CKO, and the fall period of the clock signal CK4 is shorter than the fall period of clock signal CKO, as shown in FIG. 5. The rise period is the period from the timing when the voltage reaches a specified lower limit to the timing when the voltage reaches a specified upper limit, and the fall period is the period from the timing when the voltage reaches the upper limit to the timing when the voltage reaches the lower limit. The method for specifying the upper and lower limits differs depending on the type of the signal waveform, product specifications, and other factors. As typical examples, the lower limit is 20% of the power source voltage, and the upper limit is 80% of the power source voltage.

The clock signal CK4 has a waveform having steep rising and falling edges as described above and has a substantially fixed oscillation amplitude. As a result, the duty ratio and the DC bias of the clock signal CK4 have a linear relationship, as shown in FIG. 7, and the duty ratio can be accurately calculated from the DC bias. Furthermore, the correlation between the duty ratio of the clock signal CK4 and the duty ratio of the clock signal CKO can be determined, for example, from the result of a simulation of the operation of the oscillator 1 and the result of evaluation of the oscillator 1, whereby the duty ratio of the clock signal CKO can be accurately calculated from the duty ratio of the color signal CK4 based on the correlation.

Therefore, in the present embodiment, the input node of RC filter 60 is coupled to the output node of prebuffer 25 instead of the output nodes of output buffers 24, 26, and the DC voltage outputted from the RC filter 60 corresponds to the DC bias of the clock signal CK4. Since the output node of the RC filter 60 is electrically coupled to the terminal T3, the external apparatus can calculate the duty ratio of the clock signal CK4 in the duty ratio inspection mode based on the voltage at the terminal T3 along with the relationship shown in FIG. 7. Furthermore, the external apparatus can accurately calculate the duty ratio of the clock signal CKO based on the correlation between the duty ratio of the clock signal CK4 and the duty ratio of the clock signal CKO. The clock signal CKO may be a clock signal having a clipped sinusoidal waveform outputted from the output buffer 26, or may be a clock signal having a CMOS output waveform outputted from the output buffer 24.

The input node of the RC filter 60 may be coupled to the output node of the prebuffer 23. In the present embodiment, the prebuffer 23 drives only the output buffer 24 and has a driving capability higher than that of the waveform shaping circuit 21, so that the clock signal CK3 outputted from the prebuffer 23 has a rectangular waveform. The duty ratio and the DC bias of the clock signal CK3 therefore have a linear relationship.

Figure 8:
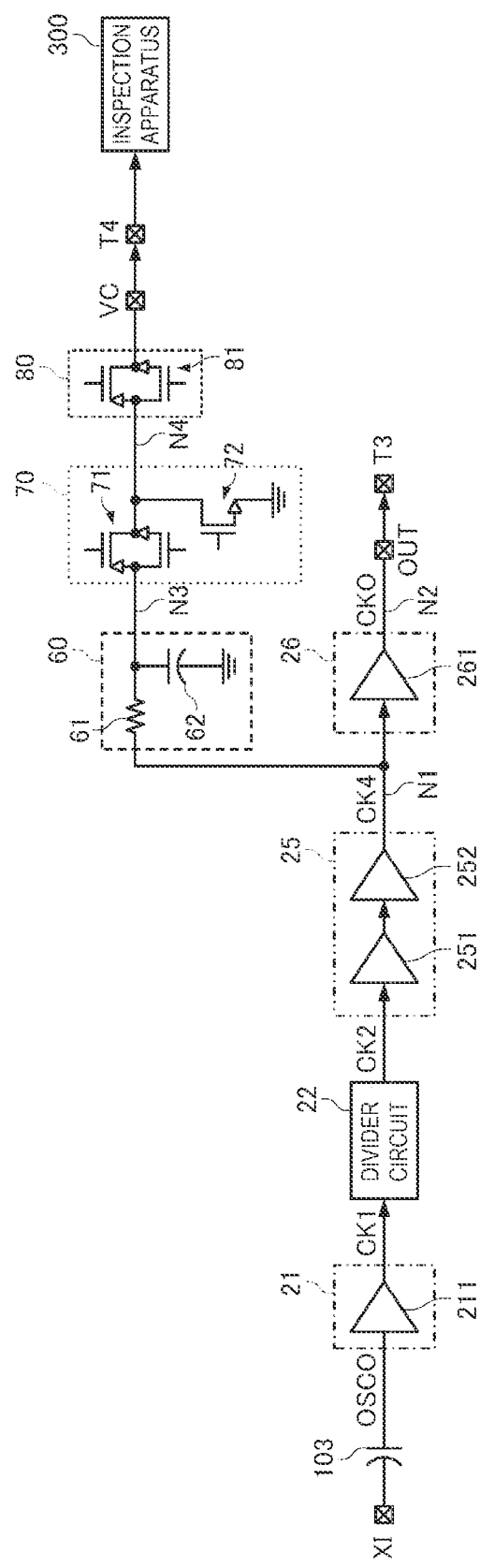
FIG. 8 shows details of each circuit in a signal propagation path from a terminal XI to a terminal T3 or T4 in the first embodiment.

FIG. 8 shows details of each circuit in the signal propagation path from the terminal XI to the terminal T3 or T4 in the duty ratio inspection mode.

The waveform shaping circuit 21 includes a buffer circuit 211, and the buffer circuit 211 outputs the clock signal CK1 based on the oscillation signal OSCO, as shown in FIG. 8. Specifically, the buffer circuit 211 receives the oscillation signal OSCO from the terminal XI via the capacitive element 103 and outputs the clock signal CK1.

The divider circuit 22 outputs the clock signal CK2 based on an oscillation signal OSCO. Specifically, the divider circuit 22 receives the clock signal CK1 based on the oscillation signal OSCO and outputs the clock signal CK2 as a result of the division of the clock signal CK1.

The prebuffer 25 includes buffer circuits 251 and 252, and the buffer circuit 252 outputs the clock signal CK4 based on the oscillation signal OSCO. Specifically, the clock signal CK2 based on the oscillation signal OSCO is inputted to the buffer circuit 251, and the buffer circuit 252 receives the output signal from the buffer circuit 251 and outputs the clock signal CK4.

The output buffer 26 includes a buffer circuit 261, and the buffer circuit 261 outputs the clock signal CKO based on the clock signal CK4. Specifically, the buffer circuit 261 receives the clock signal CK4 outputted from the buffer circuit 252 and outputs the clock signal CKO. The terminal OUT is electrically coupled to a node N2, via which the buffer circuit 261 outputs the clock signal CKO, and the clock signal CKO is outputted out of the oscillator 1 via the terminals OUT and T3.

The RC filter 60 is a low-pass filter electrically coupled to and disposed between a node N1, via which the buffer circuit 252 outputs the clock signal CK4, and the switch circuit 70 and formed of a resistive element 61 and a capacitive element 62. One end of the resistive element 61 is electrically coupled to the node N1, and the capacitive element 62 is coupled to and disposed between the other end of the resistive element 61 and the ground. A DC voltage that is the smoothened voltage of the clock signal CK4 is outputted from a node N3, to which the other end of the resistive element 61 and one end of the capacitive element 62 are coupled.

The switch circuit 70 is a switch circuit that electrically couples or decouples the node N1 to or from the terminal VC, and includes a transmission gate 71 and an N-channel-type MOS transistor 72. Similarly, the switch circuit 80 is a switch circuit that electrically couples or decouples the node N1 to or from the terminal VC, and includes a transmission gate 81.

One end of the transmission gate 71 is coupled to the node N3, and the MOS transistor 72 is coupled to and disposed between the other end of the transmission gate 71 and the ground. The transmission gate 81 has one end coupled to a node N4, where the other end of the transmission gate 71 and the drain of the MOS transistor 72 are coupled to each other, and another end coupled to the terminal VC. Therefore, the terminal VC can be electrically coupled to the node N1 via the resistive element 61 and the transmission gates 71 and 81.

In the normal operation mode and the external communication mode, both the transmission gates 71 and 81 are opened, so that the node N1 and the terminal VC are electrically decoupled from each other. When the transmission gate 71 is opened, the MOS transistor 72 is turned on, so that the node N4 is electrically coupled to the ground.

On the other hand, in the duty ratio inspection mode, the transmission gates 71 and 81 are both closed, so that the node N1 and the terminal VC are electrically coupled to each other via the resistive element 61 and the transmission gates 71 and 81. The voltage at the terminal T4 coupled to the terminal VC becomes a DC voltage that is the smoothened voltage of the clock signal CK4.

An inspection apparatus 300, which is an apparatus external to the oscillator 1, is coupled to the terminal T4. The inspection apparatus 300 sets the duty ratio inspection mode as the operation mode of the oscillator 1 and measures the voltage at the terminal T4. The inspection apparatus 300 can then calculate the duty ratio of the clock signal CK4 based on the measured voltage at the terminal T4 and calculate the duty ratio of the clock signal CKO based on the duty ratio of the clock signal CK4.

The buffer circuit 252 has a drive capability higher than that of the buffer circuit 211 electrically coupled to and disposed between the output node of the oscillation circuit 10, from which the oscillation signal OSCO is outputted, and the buffer circuit 252. The clock signal CK4 outputted from the buffer circuit 252 to the node N1 therefore has rise and fall periods shorter than those of the clock signal CK1 outputted from the buffer circuit 211. The linearity of the relationship between the duty ratio and the DC bias of the clock signal CK4 is therefore higher than that of the clock signal CK1, whereby the inspection apparatus 300 can accurately calculate the duty ratio of the clock signal CK4 based on the measured voltage at the terminal T4. Furthermore, since node N1 is the input node of buffer circuit 261, the difference between the duty ratio of clock signal CK4 and the duty ratio of the clock signal CKO is small, whereby the inspection apparatus 300 can accurately calculate the duty ratio of the clock signal CKO based on the duty ratio of the clock signal CK4.

In the present embodiment, the clock signal CK4 is an example of a first clock signal, and the clock signal CKO is an example of a second clock signal. The buffer circuit 252 is an example of a first buffer circuit, the buffer circuit 261 is an example of a second buffer circuit, and the buffer circuit 211 is an example of a third buffer circuit. The node N1 is an example of a first node, and the node N2 is an example of a second node. The terminal VC is an example of a first terminal, and the terminal OUT is an example of a second terminal.

Figure 9:
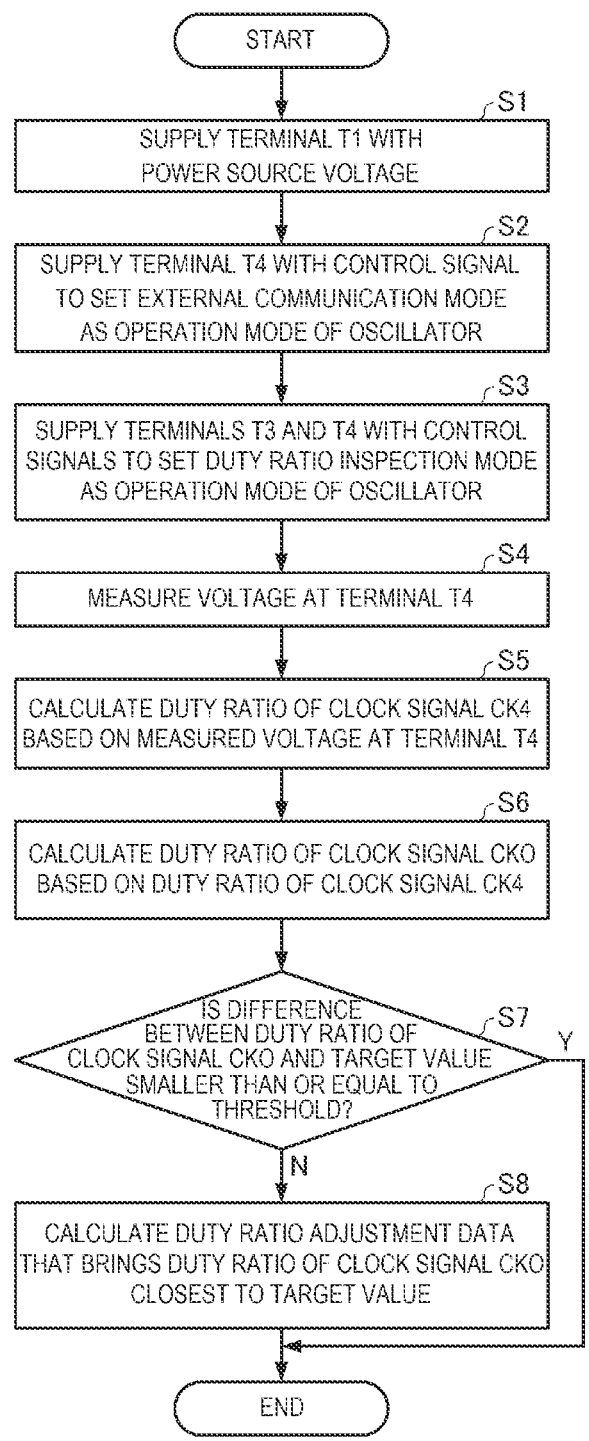
FIG. 9 is a flowchart showing an example of the procedure of a method for inspecting the duty ratio of the clock signal CKO outputted from the oscillator according to the first embodiment.
Figure 10:
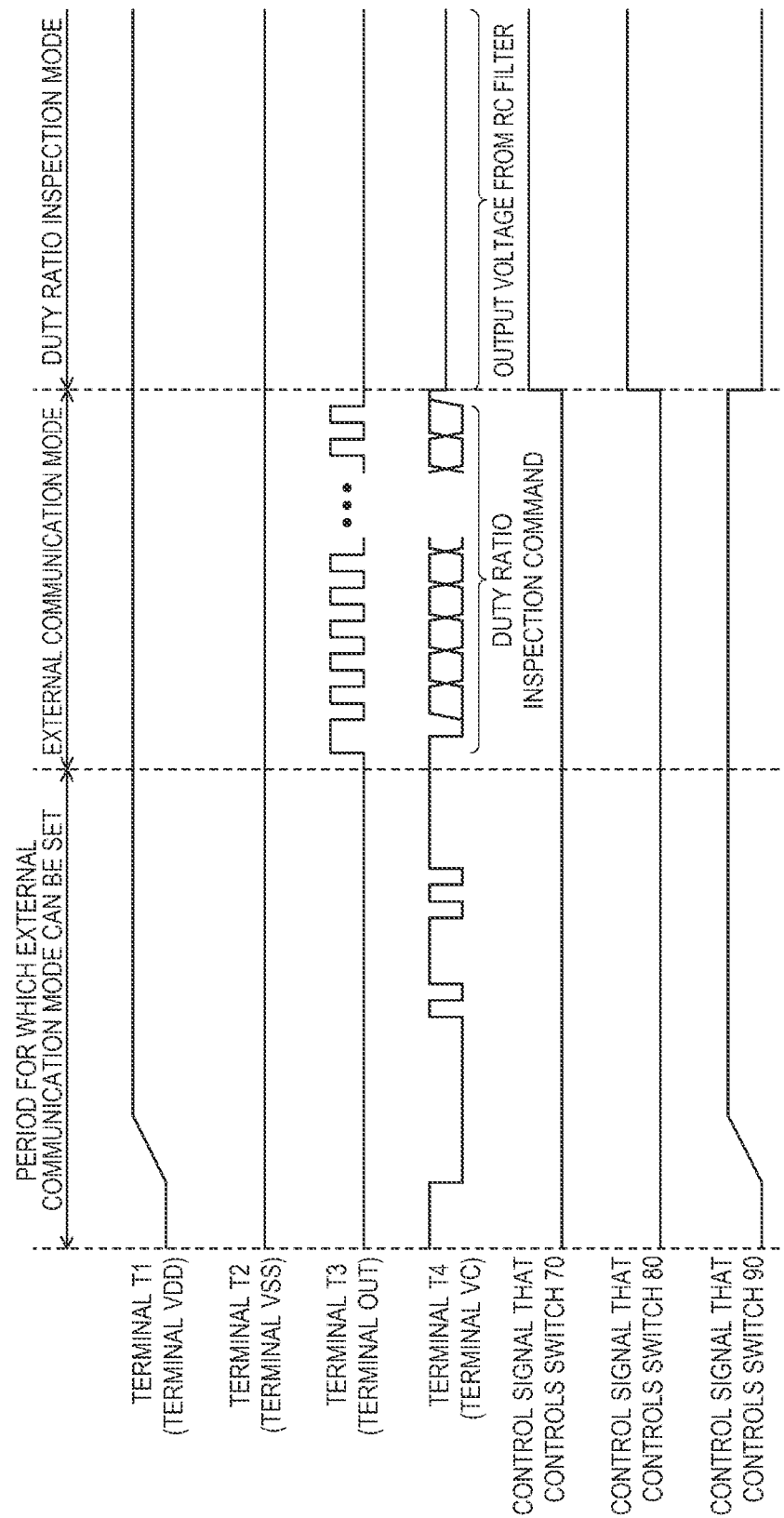
FIG. 10 shows terminals and an example of the voltage waveforms of control signals that control switches in the duty ratio inspection.

FIG. 9 is a flowchart showing an example of the procedure of a method for inspecting the duty ratio of the clock signal CKO outputted from the oscillator 1 according to the first embodiment. FIG. 10 shows terminals and an example of the voltage waveforms of control signals that control switches in the duty ratio inspection according to the flowchart in FIG. 9.

In the example shown in FIG. 9, the inspection apparatus 300 first supplies the terminal T1 of the oscillator 1 with the power source voltage (step S1). In step S1, the voltage at the terminal T1 is raised from the ground voltage to a desired voltage, as shown in FIG. 10. A variety of pieces of information including the duty ratio adjustment data stored in the nonvolatile memory 52 are transferred to the register 51 and supplied from the logic circuit 36 to the circuits.

The inspection apparatus 300 then supplies the terminal T4 of the oscillator 1 with a control signal to set the external communication mode as the operation mode of the oscillator 1 (step S2). That is, within a predetermined period after supplying the power source voltage to the terminal T1, the inspection apparatus 300 supplies the terminal T4 of the oscillator 1 with a signal having a predetermined pattern specified in advance to set the external communication mode as the operation mode of the oscillator 1, as shown in FIG. 10.

The inspection apparatus 300 then supplies the terminals T3 and T4 of the oscillator 1 with control signals to set the duty ratio inspection mode as the operation mode of the oscillator 1 (step S3). That is, the inspection apparatus 300 supplies the terminal T3 with the serial clock signal and the terminal T4 with the duty ratio inspection command as the serial data signal in the external communication mode to set the duty ratio inspection mode as the operation mode of the oscillator 1, as shown in FIG. 10. In step S3, the operation mode of the oscillator 1 is shifted from the external communication mode to the duty ratio inspection mode, control signals from the switch circuits 70 and 80 change from the low level to the high level, and the control signal from the switch circuit 90 changes from the high level to the low level, as shown in FIG. 10. As a result, the switch circuits 70 and 80 are both closed, so that the terminal T4 and the output node of the RC filter 60 are electrically coupled to each other, and the voltage at the terminal T4 becomes the DC voltage outputted from the RC filter 60.

The inspection apparatus 300 then measures the voltage at the terminal T4 of the oscillator 1 (step S4). That is, the inspection apparatus 300 measures the DC voltage outputted from the RC filter 60.

The inspection apparatus 300 then calculates the duty ratio of the clock signal CK4 based on the voltage at the terminal T4 measured in the step S4 (step S5).

The inspection apparatus 300 then calculates the duty ratio of the clock signal CKO based on the duty ratio of the clock signal CK4 calculated in step S5 (step S6).

Thereafter, when the difference between the duty ratio of the clock signal CKO calculated in step S6 and a target value is smaller than or equal to a threshold (Y in step S7), the inspection apparatus 300 terminates the entire processes. The target value is, for example, 50%. The threshold is set, for example, at adjustment resolution of the duty ratio of the clock signal CKO based on the duty ratio adjustment data.

When the difference between the duty ratio of the clock signal CKO calculated in step S6 and the target value is greater than the threshold (N in step S7), the inspection apparatus 300 calculates duty ratio adjustment data that brings the duty ratio of the clock signal CKO closest to the target value based on the difference (step S8), and the inspection apparatus 300 terminates the entire processes.

For example, after completing a series of inspections, the inspection apparatus 300 writes the duty ratio adjustment data calculated in the step S8 and other pieces of necessary information to the nonvolatile memory 52.

1-4. Effects and Advantages

As described above, in the circuit apparatus 2 of the oscillator 1 according to the first embodiment, the node N1, via which the buffer circuit 252 provided in the prebuffer 25 outputs the clock signal CK4, is electrically coupled to the terminal VC, so that the voltage at the terminal VC becomes a DC voltage of the clock signal CK4 smoothened by the RC filter 60. The rise and fall periods of the clock signal CK4 are shorter than the rise and fall periods of the clock signal CKO, which is outputted from the buffer circuit 261, which is the output buffer 26, out of the oscillator 1 via the terminals OUT and T3. The correlation between the duty ratio and the DC bias of the clock signal CK4 is therefore more linear than the correlation between the duty ratio and the DC bias of the clock signal CKO. The inspection apparatus 300 can therefore accurately calculate the duty ratio of the clock signal CK4 based on the voltage at the terminal T4 coupled to the terminal VC and further accurately calculate the duty ratio of the clock signal CKO based on the relationship between the duty ratio of the clock signal CK4 and the duty ratio of the clock signal CKO.

Furthermore, in the circuit apparatus 2 of the oscillator 1 according to the first embodiment, the resistive element 61, which forms the RC filter 60, reduces the adverse effect of the capacitance of the transmission gate 71, which forms the switch circuit 70, on the buffer circuit 261, which is the output buffer 26, whereby a risk of an increase in noise components of the clock signal CKO and deterioration of the duty ratio can be reduced.

Moreover, in the oscillator 1 according to the first embodiment, the node N1 is electrically decoupled from the terminals VC and T4 in the normal operation mode. Therefore, even when a signal is inputted from the terminal T4, the risk of an increase in the noise components of the clock signal CKO and degradation of the duty ratio due to the propagation of the signal from the terminal T4 to the node N1 via the terminal VC is reduced. Conversely, the configuration described above further reduces a risk that the DC voltage of the smoothened clock signal CK4 propagates to the frequency control circuit 34, which is electrically coupled to the terminal VC, and adversely affects the frequency control circuit 34 and therefore causes malfunctions of the circuit apparatus 2. Furthermore, the oscillator 1 according to the first embodiment, in which the terminals T4 and VC are used in both the normal operation mode and the duty ratio inspection mode, eliminates the need for a dedicated terminal via which the DC voltage of the smoothened clock signal CK4 is outputted out of the oscillator 1.

In the oscillator 1 according to the first embodiment, in which the circuit apparatus 2 includes the RC filter 60, it is not necessary for calculation of the duty ratio of the clock signal CK4 to provide a resistive element and a capacitive element that form the RC filter outside the circuit apparatus 2. The oscillator 1 according to the first embodiment therefore allows reduction in cost required for construction of the inspection system.

In the circuit apparatus 2 of the oscillator 1 according to the first embodiment, the buffer circuit 252 provided in the prebuffer 25 has a driving capability higher than that of the buffer circuit 211, which is the waveform shaping circuit 21. That is, the clock signal CK4 outputted from the buffer circuit 252 has rise and fall periods shorter than those of the clock signal CK1 outputted from the buffer circuit 211. The clock signal CK4 therefore has a more linear relationship between the duty ratio and the DC bias than the clock signal CK1. The inspection apparatus 300 can therefore accurately calculate the duty ratio of the clock signal CKO based on the voltage at the terminal T4 and further accurately calculate the duty ratio of the clock signal CKO based on the relationship between the duty ratio of the clock signal CK4 and the duty ratio of the clock signal CKO.

In the circuit apparatus 2 of the oscillator 1 according to the first embodiment, the node N1, via which the buffer circuit 252 outputs the clock signal CK4, is the input node of the buffer circuit 261. That is, since the node N1 is close to the output node of the buffer circuit 261, the difference between the duty ratio of the clock signal CK4 and the duty ratio of the clock signal CKO is small. The inspection apparatus 300 can therefore accurately calculate the duty ratio of the clock signal CKO based on the duty ratio of the clock signal CK4.

2. Second Embodiment

In the oscillator 1 according to the first embodiment, the terminals T4 and VC, via which a voltage for controlling the frequency of the clock signal CKO is inputted in the normal operation mode, are used also as the terminals via which the output voltage from the RC filter 60 is outputted in the duty ratio inspection mode. In contrast, the oscillator according to a second embodiment includes a dedicated external terminal via which the output voltage from the RC filter 60 is outputted. In the following description of the oscillator 1 according to the second embodiment, the same configurations as those in the first embodiment have the same reference characters, and the same descriptions as those in the first embodiment are omitted or simplified, and contents different from those in the first embodiment will be primarily described.

Figure 11:
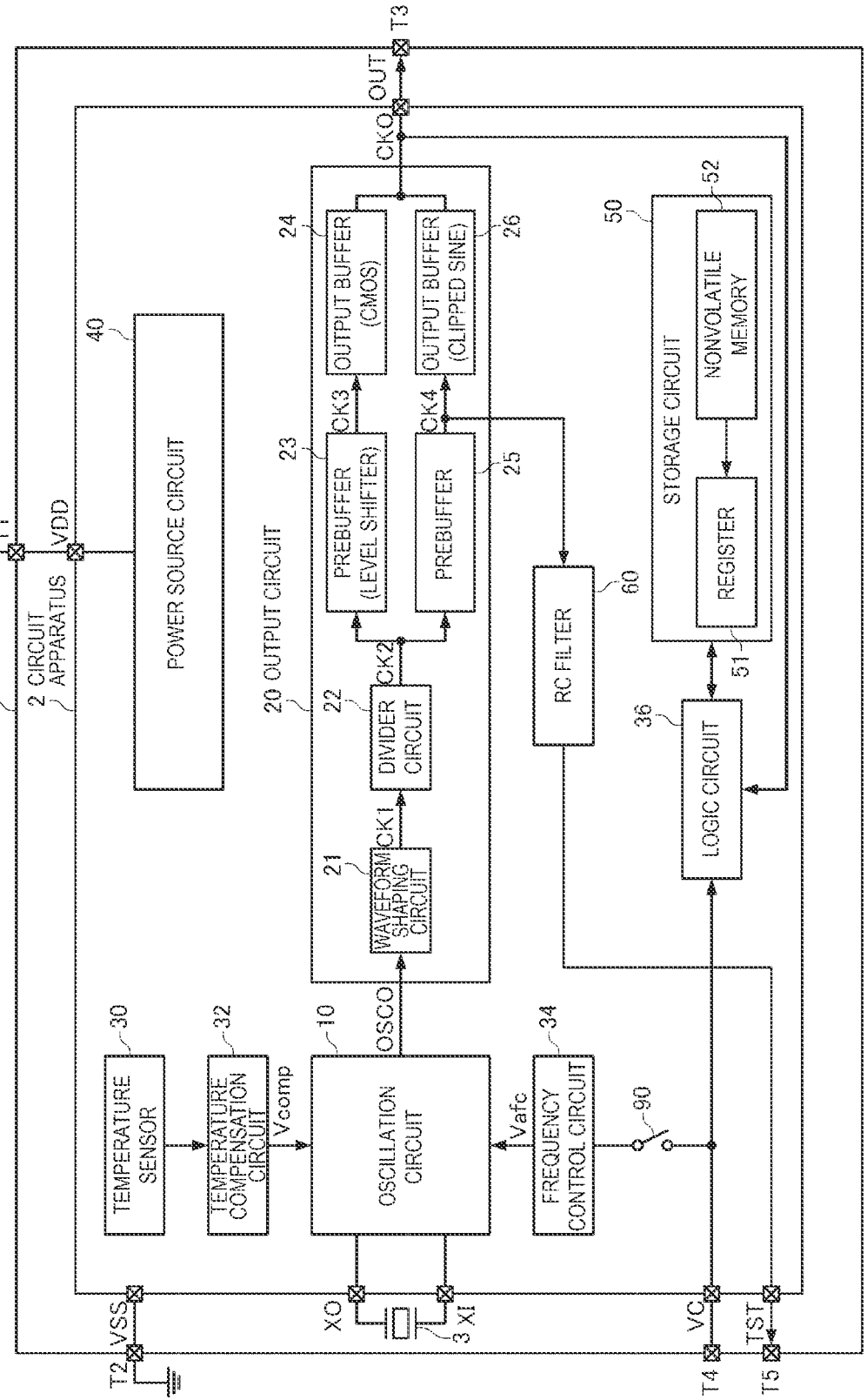
FIG. 11 is a functional block diagram of the oscillator according to a second embodiment.

FIG. 11 is a functional block diagram of the oscillator 1 according to the second embodiment. The oscillator 1 according to the second embodiment further includes a terminal T5 as the external terminals 6 in addition to the terminals T1, T2, T3, and T4, as shown in FIG. 11. The circuit apparatus 2 further includes a terminal TST as the external coupling terminals in addition to the terminals VDD, VSS, OUT, VC, XI, and XO. The terminals T5 and TST are electrically coupled to each other, and the terminal TST and the output node of the RC filter 60 are electrically coupled to each other. As a result, the DC voltage outputted from the RC filter 60 is outputted via the terminal TST out of the oscillator 1 from the terminal T5, and the external apparatus can calculate the duty ratio of the clock signal CK4 based on the voltage at the terminal T5.

The terminals T5 and TST are dedicated terminals via which the DC voltage outputted from the RC filter 60 is outputted. The circuit apparatus 2 therefore does not need to include the switch circuit 70 or 80, unlike the first embodiment. Furthermore, when the switch circuit 70 or 80 is not provided, the DC voltage is outputted via the terminal T5 even in the normal operation mode, so that the oscillator 1 and the circuit apparatus 2 may not have the duty ratio inspection mode.

The other configurations of the oscillator 1 according to the second embodiment are the same as those of the oscillator 1 according to the first embodiment and will therefore not be described.

Figure 12:
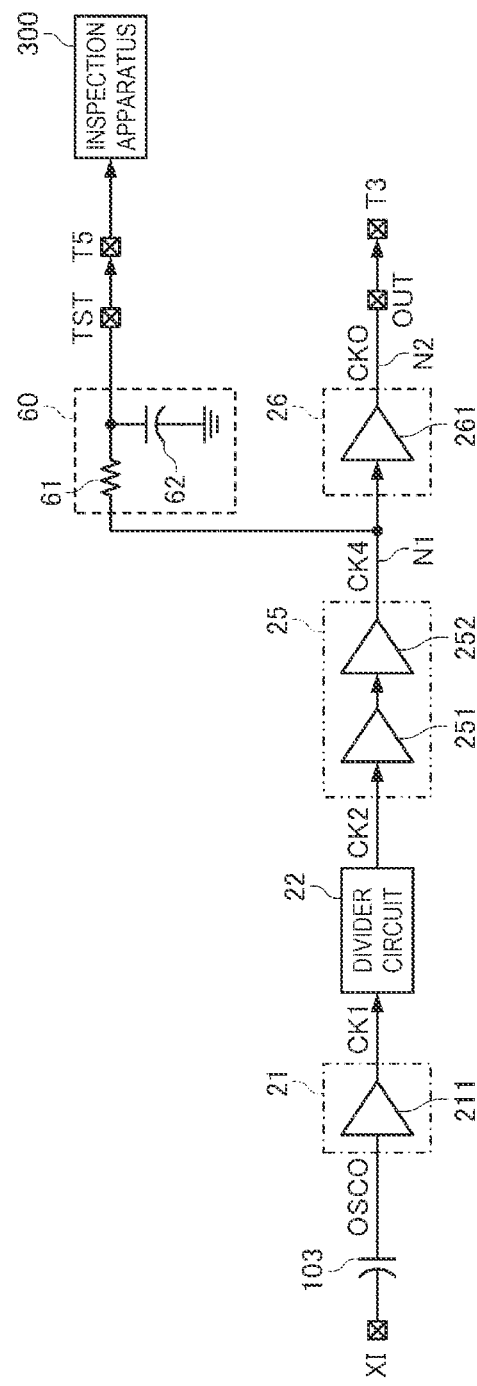
FIG. 12 shows details of each circuit in the signal propagation path from the terminal XI to the terminal T3 or a terminal T5 in the second embodiment.

FIG. 12 shows details of each circuit in the signal propagation path from the terminal XI to the terminal T3 or T5. In FIG. 12, the configuration of each circuit in the signal propagation path from the terminal XI to the terminal T3 is the same as that in FIG. 8 and will therefore not be described.

The RC filter 60 is a low-pass filter formed of the resistive element 61 and the capacitive element 62, and is electrically coupled to and disposed between the node N1 and the terminal T4, as shown in FIG. 12. One end of the resistive element 61 is electrically coupled to the node N1, via which the buffer circuit 252 outputs the clock signal CK4, and the capacitive element 62 is coupled to and disposed between the other end of the resistive element 61 and the ground. The node to which the other end of the resistive element 61 and one end of the capacitive element 62 are coupled is coupled to the terminal TST. The node N1 and the terminal TST are electrically coupled to each other via the resistive element 61, and the voltage at the terminal T5 coupled to the terminal TST is a DC voltage that is the voltage of the clock signal CK1 smoothened by the RC filter 60.

The inspection apparatus 300, which is an apparatus external to the oscillator 1, is coupled to the terminal T5. The inspection apparatus 300 can measure the voltage at the terminal T5, calculate the duty ratio of the clock signal CK4 based on the measured voltage at the terminal T5 and calculate the duty ratio of the clock signal CKO based on the duty ratio of the clock signal CK4.

In the present embodiment, the clock signal CK4 is an example of the first clock signal, and the clock signal CKO is an example of the second clock signal. The buffer circuit 252 is an example of the first buffer circuit, the buffer circuit 261 is an example of the second buffer circuit, and the buffer circuit 211 is an example of the third buffer circuit. The node N1 is an example of the first node, and the node N2 is an example of the second node. The terminal TST is an example of the first terminal, and the terminal OUT is an example of the second terminal.

Figure 13:
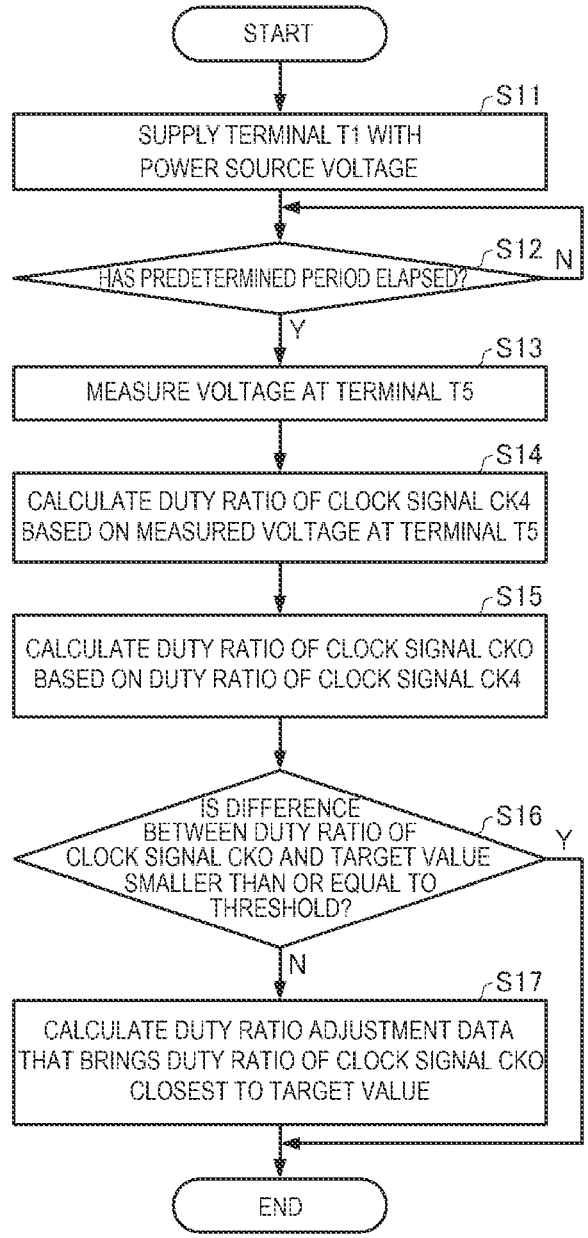
FIG. 13 is a flowchart showing an example of the procedure of the method for inspecting the duty ratio of the clock signal CKO outputted from the oscillator according to the second embodiment.

FIG. 13 is a flowchart showing an example of the procedure of the method for inspecting the duty ratio of the clock signal CKO outputted from the oscillator 1 according to the second embodiment.

In the example shown in FIG. 13, the inspection apparatus 300 first supplies the terminal T1 of the oscillator 1 with the power source voltage (step S11). In step S11, the voltage at the terminal T1 is raised from the ground voltage to a desired voltage. A variety of pieces of information including the duty ratio adjustment data stored in the nonvolatile memory 52 are transferred to the register 51 and supplied from the logic circuit 36 to the respective circuits.

The inspection apparatus 300 then waits until a predetermined period elapses (step S12). For example, the predetermined period is set at value longer than or equal to the period required for stabilization of the oscillation of the resonator 3.

The inspection apparatus 300 then measures the voltage at the terminal T5 of the oscillator 1 (step S13). That is, the inspection apparatus 300 measures the DC voltage outputted from the RC filter 60.

The inspection apparatus 300 then calculates the duty ratio of the clock signal CK4 based on the voltage at the terminal T5 measured in the step S13 (step S14).

The inspection apparatus 300 then calculates the duty ratio of the clock signal CKO based on the duty ratio of the clock signal CK4 calculated in step S14 (step S15).

Thereafter, when the difference between the duty ratio of the clock signal CKO calculated in step S15 and a target value is smaller than or equal to a threshold (Y in step S16), the inspection apparatus 300 terminates the entire processes. The target value is, for example, 50%. The threshold is set, for example, at adjustment resolution of the duty ratio of the clock signal CKO based on the duty ratio adjustment data.

When the difference between the duty ratio of the clock signal CKO calculated in step S15 and the target value is greater than the threshold (N in step S16), the inspection apparatus 300 calculates duty ratio adjustment data that brings the duty ratio of the clock signal CKO closest to the target value based on the difference (step S17), and the inspection apparatus 300 terminates the entire processes.

For example, after completing a series of inspections, the inspection apparatus 300 writes the duty ratio adjustment data calculated in the step S17 and other pieces of necessary information to the nonvolatile memory 52.

In the circuit apparatus 2 of the oscillator 1 according to the second embodiment described above, the node N1, via which the buffer circuit 252 provided in the prebuffer 25 outputs the clock signal CK4, is electrically coupled to the terminal TST, so that the voltage at the terminal TST becomes a DC voltage of the clock signal CK4 smoothened by the RC filter 60. The rise and fall periods of the clock signal CK4 are shorter than the rise and fall periods of the clock signal CKO, which is outputted from the buffer circuit 261, which is the output buffer 26, out of the oscillator 1 via the terminals OUT and T3. The correlation between the duty ratio and the DC bias of the clock signal CK4 is therefore more linear than the correlation between the duty ratio and the DC bias of the clock signal CKO. The inspection apparatus 300 can therefore accurately calculate the duty ratio of the clock signal CK4 based on the voltage at the terminal T5 coupled to the terminal TST and further accurately calculate the duty ratio of the clock signal CKO based on the relationship between the duty ratio of the clock signal CK4 and the duty ratio of the clock signal CKO.

The oscillator 1 according to the second embodiment, in which the terminals T5 and TST are used as dedicated terminals via which the DC voltage of the smoothened clock signal CK4 is outputted out of the oscillator 1, reduces the risk that the DC voltage of the smoothened clock signal CK4 propagates to circuits electrically coupled to terminals different from the terminals T5 and TST and adversely affects the circuits and therefore causes malfunctions of the circuit apparatus 2.

In the oscillator 1 according to the second embodiment, in which the circuit apparatus 2 includes the RC filter 60, it is not necessary for calculation of the duty ratio of the clock signal CK4 to provide a resistive element and a capacitive element that form the RC filter outside the circuit apparatus 2. The oscillator 1 according to the second embodiment therefore allows reduction in cost required for construction of the inspection system.

In addition to the effects described above, the oscillator 1 according to the second embodiment also provides the same effects as those provided by the oscillator 1 according to the first embodiment described above.

3. Third Embodiment

The oscillator 1 according to the first embodiment includes the RC filter 60, which smoothens the voltage of the clock signal CK4. In contrast, the oscillator 1 according to a third embodiment does not include the RC filter 60, which smoothens the voltage of the clock signal CK4. In the following description of the oscillator 1 according to the third embodiment, the same configurations as those in the first embodiment have the same reference characters, and the same descriptions as those in the first embodiment are omitted or simplified, and contents different from those in the first embodiment will be primarily described.

Figure 14:
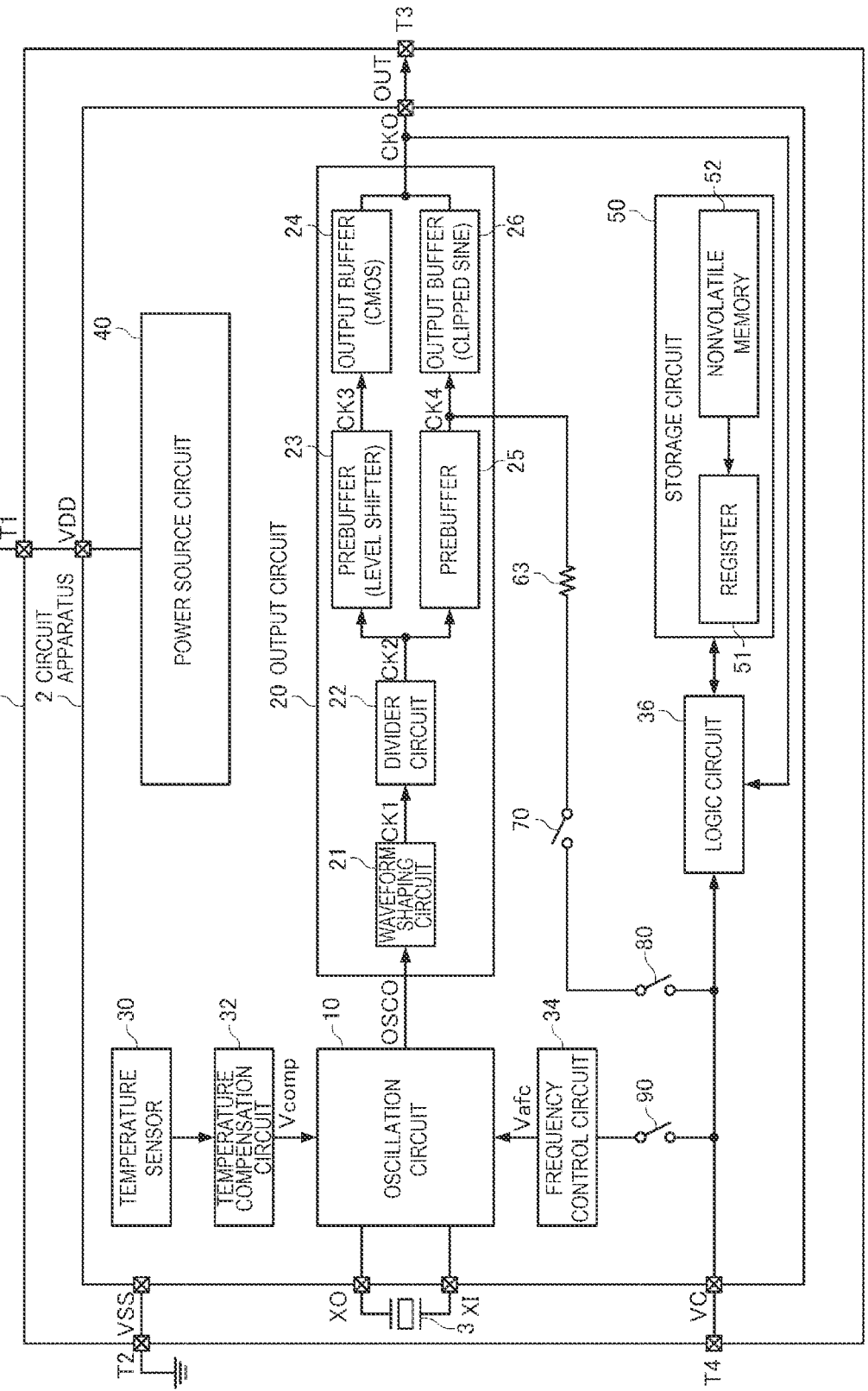
FIG. 14 is a functional block diagram of the oscillator according to a third embodiment.

FIG. 14 is a functional block diagram of the oscillator 1 according to the third embodiment. In the oscillator 1 according to the third embodiment, the circuit apparatus 2 includes a resistive element 63, as shown in FIG. 14. The resistive element 63 has one end coupled to the output node of the prebuffer 25, and another end electrically coupled to the terminal VC when the switch circuits 70 and 80 are both closed. In the present embodiment, the switch circuits 70 and 80 are closed and the switch circuit 90 is opened in the duty ratio inspection mode, so that the terminal VC and the output node of the prebuffer 25 are electrically coupled to each other via the resistive element 63, and the terminal VC and the input node of the frequency control circuit 34 are electrically decoupled from each other. As a result, the clock signal CK4 outputted from the prebuffer 25 is outputted via the terminal VC out of the oscillator 1 from the terminal T4. The external apparatus then calculates the duty ratio of the clock signal CK4 outputted from the terminal T4.

The other configurations of the oscillator 1 according to the third embodiment are the same as those of the oscillator 1 according to the first embodiment and will therefore not be described.

Figure 15:
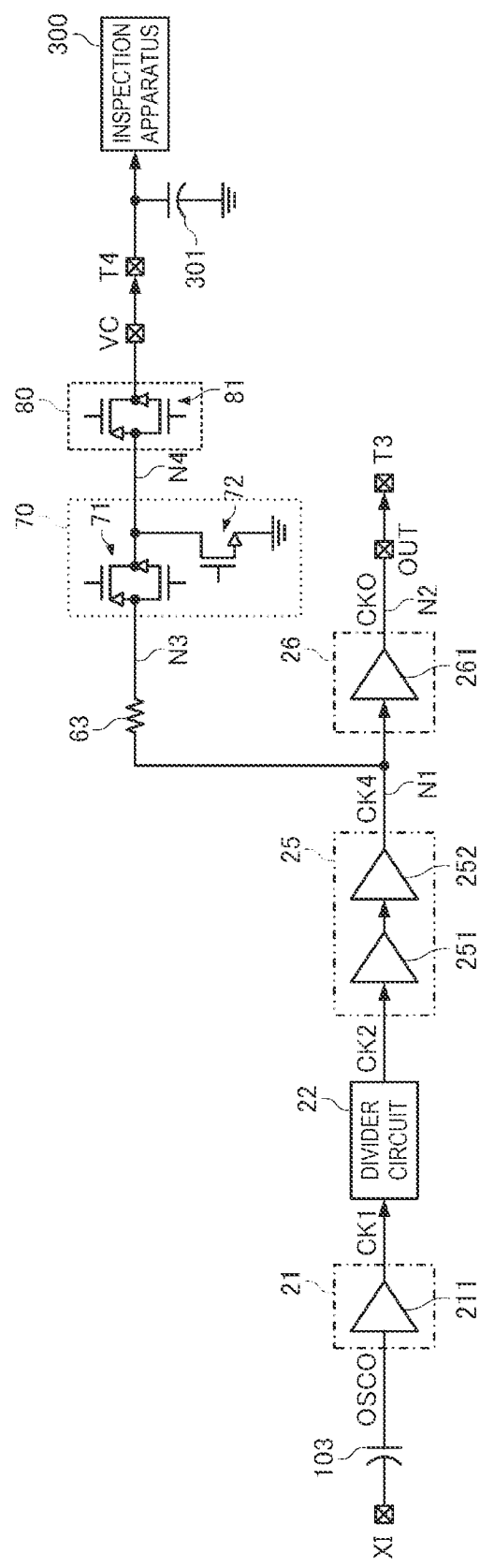
FIG. 15 shows details of each circuit in the signal propagation path from the terminal XI to the terminal T3 or T4 in the third embodiment.

FIG. 15 shows details of each circuit in the signal propagation path from the terminal XI to the terminal T3 or T4. In FIG. 15, the configuration of each circuit in the signal propagation path from the terminal XI to the terminal T3 is the same as that in FIG. 8 and will therefore not be described.

The resistive element 63 is electrically coupled to and disposed between the node N1, via which the buffer circuit 252 outputs the clock signal CK4, and the switch circuit 70.

The terminal VC can be electrically coupled to the node N1 via the resistive element 61 and the transmission gates 71 and 81.

In the normal operation mode and the external communication mode, both the transmission gates 71 and 81 are opened, so that the node N1 and the terminal VC are electrically decoupled from each other. When the transmission gate 71 is opened, the MOS transistor 72 is turned on, so that the node N4 is electrically coupled to the ground.

On the other hand, in the duty ratio inspection mode, the transmission gates 71 and 81 are both closed, and the node N1 and the terminal VC are electrically coupled to each other via the resistive element 63 and the transmission gates 71 and 81.

Outside the oscillator 1, a capacitive element 301 is coupled to and disposed between the terminal T4 and the ground, and when the transmission gates 71 and 81 are both closed, the resistive element 63 and the capacitive element 301 form an RC filter. Therefore, in the duty ratio inspection mode, the voltage at the terminal T4 becomes a DC voltage that is the smoothened voltage of the clock signal CK4.

The inspection apparatus 300, which is an apparatus external to the oscillator 1, is coupled to the terminal T4. The inspection apparatus 300 sets the duty ratio inspection mode as the operation mode of the oscillator 1 and measures the voltage at the terminal T4. The inspection apparatus 300 can then calculate the duty ratio of the clock signal CK4 based on the measured voltage at the terminal T4 and calculate the duty ratio of the clock signal CKO based on the duty ratio of the clock signal CK4.

In the present embodiment, the clock signal CK4 is an example of the first clock signal, and the clock signal CKO is an example of the second clock signal. The buffer circuit 252 is an example of the first buffer circuit, the buffer circuit 261 is an example of the second buffer circuit, and the buffer circuit 211 is an example of the third buffer circuit. The node N1 is an example of the first node, and the node N2 is an example of the second node. The terminal VC is an example of the first terminal, and the terminal OUT is an example of the second terminal.

The flowchart showing an example of the procedure of the method for inspecting the duty ratio of the clock signal CKO outputted from the oscillator 1 according to the third embodiment is the same as that in FIG. 9 and will therefore not be illustrated or described.

In the circuit apparatus 2 of the oscillator 1 according to the third embodiment described above, when the VC terminal is electrically coupled to the node N1, via which the buffer circuit 252 provided in the prebuffer 25 outputs the clock signal CK4, the resistive element 63 and the capacitive element 301 coupled to the terminal T4 form an RC filter. As a result, the voltage at the terminal T4 becomes a DC voltage of the clock signal CK4 smoothened by the RC filter. The rise and fall periods of the clock signal CK4 are shorter than the rise and fall periods of the clock signal CKO, which is outputted from the buffer circuit 261, which is the output buffer 26, out of the oscillator 1 via the terminals OUT and T3. The correlation between the duty ratio and the DC bias of the clock signal CK4 is therefore more linear than the correlation between the duty ratio and the DC bias of the clock signal CKO. The inspection apparatus 300 can therefore accurately calculate the duty ratio of the clock signal CK4 based on the voltage at the terminal T4 and further accurately calculate the duty ratio of the clock signal CKO based on the relationship between the duty ratio of the clock signal CK4 and the duty ratio of the clock signal CKO.

Furthermore, in the circuit apparatus 2 of the oscillator 1 according to the third embodiment, the resistive element 63 reduces the adverse effect of the capacitance of the transmission gate 71, which forms the switch circuit 70, on the buffer circuit 261, whereby the risk of an increase in noise components of the clock signal CKO and deterioration of the duty ratio can be reduced.

In the oscillator 1 according to the third embodiment, in which the node N1 is electrically decoupled from the terminals VC and T4 in the normal operation mode, even when a signal is inputted via the terminal T4, the risk of an increase in noise components of the clock signal CKO and deterioration of the duty ratio due to the propagation of the signal from the terminal T4 to the node N1 via the terminal VC is reduced. Conversely, the configuration described above further reduces a risk that the clock signal CK4 propagates to the frequency control circuit 34, which is electrically coupled to the terminal VC, and adversely affects the frequency control circuit 34 and hence causes malfunctions of the circuit apparatus 2. Furthermore, the oscillator 1 according to the third embodiment, in which the terminals T4 and VC are used in both the normal operation mode and the duty ratio inspection mode, eliminates the need for a dedicated terminal via which the clock signal CK4 is outputted out of the oscillator 1.

In addition to the effects described above, the oscillator 1 according to the third embodiment also provides the same effects as those provided by the oscillator 1 according to the first embodiment described above.

4. Variations

The present disclosure is not limited to the embodiments described above, and a variety of changes can be made thereto within the scope of the substance of the present disclosure.

In the oscillator 1 according to the third embodiment described above, the terminals T4 and VC, via which the voltage for controlling the frequency of the clock signal CKO is inputted in the normal operation mode, are also used as the terminals via which the output voltage from the RC filter 60 is outputted in the duty ratio inspection mode. In contrast, the oscillator 1 according to the third embodiment may be changed so as to include a dedicated external terminal via which the output voltage from the RC filter 60 is outputted, as the oscillator 1 according to the second embodiment.

In each of the embodiments described above, a serial clock signal is inputted to the circuit apparatus 2 via the terminal OUT and a serial data signal is inputted to the circuit apparatus 2 via the terminal VC, and the terminals via which the serial clock signal and the serial data signal are inputted may be terminals other than the terminals described above.

In each of the embodiments described above, the clock signal outputted from the output buffer 24 or the clock signal outputted from the output buffer 26 is outputted out of the oscillator 1 via the terminal T3, which is one of the external terminals, and the clock signals described above may be outputted via a different external terminal.

The oscillator 1 according to each of the embodiments described above is an oscillator having the temperature compensation function and the frequency control function, such as a voltage controlled temperature compensated crystal oscillator (VC-TCXO), and may instead be a simple oscillator having no temperature compensation or frequency control function, such as a simple packaged crystal oscillator (SPXO), an oscillator having the temperature compensation function, such as a temperature compensated crystal oscillator (TCXO), an oscillator having the frequency control function, such as a voltage controlled crystal oscillator (VCXO), or an oscillator having the temperature control function, such as an oven controlled crystal oscillator (OCXO).

The embodiments and the variations described above are presented by way of example, and the present disclosure is not limited thereto. For example, the embodiments and the variations can be combined with each other as appropriate.

The present disclosure encompasses substantially the same configuration as the configuration described in any of the embodiments, for example, a configuration having the same function, using the same method, and providing the same result or a configuration having the same purpose and providing the same effect. Furthermore, the present disclosure encompasses a configuration in which an inessential portion of the configuration described in any of the embodiments is replaced. Moreover, the present disclosure encompasses a configuration that provides the same effects and advantages as those provided by the configuration described in any of the embodiments or a configuration that can achieve the same purpose as that achieved by the configuration described in any of the embodiments. Furthermore, the present disclosure encompasses a configuration in which a known technology is added to the configuration described in any of the embodiments.

The following contents are derived from the embodiments and the variations described above.

A circuit apparatus according to an aspect includes an oscillation circuit that generates an oscillation signal, a first buffer circuit that outputs a first clock signal based on the oscillation signal, a second buffer circuit that outputs a second clock signal based on the first clock signal, a first terminal electrically couplable to a first node via which the first buffer circuit outputs the first clock signal, and a second terminal electrically coupled to a second node via which the second buffer circuit outputs the second clock signal, and the rise period of the first clock signal is shorter than the rise period of the second clock signal.

In the circuit apparatus, the signal based on the first clock signal is outputted via the first terminal out of the circuit apparatus when the first node to which the first buffer circuit outputs the first clock signal is electrically coupled to the first terminal. The rise period of the first clock signal is shorter than the rise period of the second clock signal outputted from the second buffer circuit via the second terminal out of the circuit apparatus. The correlation between the duty ratio and the DC bias of the first clock signal is therefore more linear than the correlation between the duty ratio and the DC bias of the second clock signal. An external apparatus can therefore, for example, accurately calculate the duty ratio of the first clock signal based on the first clock signal outputted via the first terminal out of the circuit apparatus and further accurately calculate the duty ratio of the second clock signal based on the relationship between the duty ratio of the first clock signal and the duty ratio of the second clock signal.

The circuit apparatus according to the aspect may include a switch circuit that electrically couple or decouple the first node to or from the first terminal.

In the circuit apparatus described above, the switch circuit electrically couples or decouples the first node to or from the first terminal. When the first node and the first terminal are electrically coupled to each other, the circuit apparatus operates in an operation mode in which a signal based on the first clock signal is outputted out of the circuit apparatus, whereas when the first node and the first terminal are electrically decoupled from each other, the circuit apparatus operates in a normal operation mode or any other operation mode. Therefore, according to the circuit apparatus described above, in which the first node and the first terminal are electrically decoupled from each other in the normal operation mode, even when a signal is inputted via the first terminal, the configuration of the circuit apparatus reduces the risk of an increase in noise components of the second clock signal and deterioration of the duty ratio of the second clock signal due to the propagation of the signal from the first terminal to the first node. Conversely, the configuration described above also reduces the risk that a signal based on the first clock signal propagates to a circuit electrically coupled to the first terminal and adversely affects the circuit and hence causes malfunctions of the circuit apparatus. Furthermore, the circuit apparatus described above, in which the first terminal is used in all the operation mode in which the signal based on the first clock signal is outputted out of the circuit apparatus, the normal operation mode, and other operation modes, eliminates the need for a dedicated terminal via which the signal based on the first clock signal is outputted out of the circuit apparatus.

The circuit apparatus according to the aspect may include a resistive element electrically coupled to and disposed between the first node and the switch circuit.

According to the circuit apparatus, the resistive element reduces the adverse effect of the capacitance of the switch circuit on the second buffer circuit, whereby the risk of an increase in noise components of the second clock signal and deterioration of the duty ratio of the second clock signal can be reduced.

The circuit apparatus according to the aspect may include an RC filter electrically coupled to and disposed between the first node and the switch circuit.

In the circuit apparatus described above, when the switch circuit electrically couples the first node and the first terminal to each other, the voltage at the first terminal becomes the DC voltage that the first clock signal smoothened by the RC filter. The external apparatus can therefore, for example, accurately calculate the duty ratio of the first clock signal based on the voltage at the first terminal and further accurately calculate the duty ratio of the second clock signal based on the relationship between the duty ratio of the first clock signal and the duty ratio of the second clock signal.

According to the circuit apparatus, the resistive element, which forms the RC filter, reduces the adverse effect of the capacitance of the switch circuit on the second buffer circuit, whereby the risk of an increase in noise components of the second clock signal and deterioration of the duty ratio of the second clock signal can be reduced.

According to the circuit apparatus described above, it is not necessary for calculation of the duty ratio of the first clock signal to provide a resistive element and a capacitive element that form an RC filter outside the circuit apparatus, whereby the cost required for construction of an inspection system is reduced.

The circuit apparatus according to the aspect may include an RC filter electrically coupled to and disposed between the first node and the first terminal.

In the circuit apparatus described above, in which the first node and the first terminal are electrically coupled to each other via the RC filter, the voltage at the first terminal becomes a DC voltage of the first clock signal smoothened by the RC filter. The external apparatus can therefore, for example, accurately calculate the duty ratio of the first clock signal based on the voltage at the first terminal and further accurately calculate the duty ratio of the second clock signal based on the relationship between the duty ratio of the first clock signal and the duty ratio of the second clock signal.

The circuit apparatus described above, in which the first terminal is used as a dedicated terminal via which a signal based on the first clock signal is outputted out of the circuit apparatus, reduces a risk that the signal based on the first clock signal propagates to a circuit electrically coupled to a terminal different from the first terminal and adversely affects the circuit and hence causes malfunctions of the circuit apparatus.

Furthermore, according to the circuit apparatus described above, it is not necessary for calculation of the duty ratio of the first clock signal to provide a resistive element and a capacitive element that form an RC filter outside the circuit apparatus, whereby the cost required for construction of the inspection system is reduced.

The circuit apparatus according to the aspect may include a third buffer circuit electrically coupled to and disposed between the output node of the oscillation circuit and the first buffer circuit, and the first buffer circuit may have a drive capability higher than that of the third buffer circuit.

According to the circuit apparatus described above, since the first buffer circuit has a drive capability higher than that of the third buffer circuit, the first clock signal has rise and falling periods shorter than those of the signal outputted from the third buffer circuit. The first clock signal therefore has a more linear relationship between the duty ratio and the DC bias than the signal outputted from the third buffer circuit. The external apparatus can therefore, for example, accurately calculate the duty ratio of the first clock signal based on the first clock signal outputted via the first terminal out of the circuit apparatus and further accurately calculate the duty ratio of the second clock signal based on the relationship between the duty ratio of the first clock signal and the duty ratio of the second clock signal.

In the circuit apparatus according to the aspect, the first node may be the input node of the second buffer circuit.

According to the circuit apparatus described above, since the first node is close to the output node of the second buffer circuit, the difference between the duty ratio of the first clock signal and the duty ratio of the second clock signal is small. The external apparatus can therefore accurately calculate the duty ratio of the second clock signal based on the duty ratio of the first clock signal.

An oscillator according to another aspect includes the circuit apparatus according to the aspect, and a resonator.

What is claimed is:

1. A circuit apparatus comprising:
   an oscillation circuit that generates an oscillation signal;
   a first buffer circuit that outputs a first clock signal based on the oscillation signal;
   a second buffer circuit that outputs a second clock signal based on the first clock signal;
   a first terminal electrically couplable to a first node via which the first buffer circuit outputs the first clock signal;
   a second terminal electrically coupled to a second node via which the second buffer circuit outputs the second clock signal; and
   a switch circuit that electrically couples or decouples the first node to or from the first terminal; and
   a resistive element electrically coupled to and disposed between the first node and the switch circuit,
   wherein a rise period of the first clock signal is shorter than a rise period of the second clock signal.

2. The circuit apparatus according to claim 1, further comprising an RC filter electrically coupled to and disposed between the first node and the first terminal.

3. The circuit apparatus according to claim 1,
   further comprising a third buffer circuit electrically coupled to and disposed between an output node of the oscillation circuit and the first buffer circuit,
   wherein the first buffer circuit has a drive capability higher than a drive capability of the third buffer circuit.

4. The circuit apparatus according to claim 1, wherein the first node is an input node of the second buffer circuit.

5. An oscillator comprising:
   the circuit apparatus according to claim 1; and
   a resonator.

6. A circuit apparatus comprising:
   an oscillation circuit that generates an oscillation signal;
   a first buffer circuit that outputs a first clock signal based on the oscillation signal;
   a second buffer circuit that outputs a second clock signal based on the first clock signal;
   a first terminal electrically couplable to a first node via which the first buffer circuit outputs the first clock signal;

a second terminal electrically coupled to a second node via which the second buffer circuit outputs the second clock signal;

a switch circuit that electrically couples or decouples the first node to or from the first terminal; and an RC filter eclectically coupled to and disposed between the first node and the switch circuit, wherein a rise period of the first clock signal is shorter than a rise period of the second clock signal.

7. The circuit apparatus according to claim 6, further comprising a third buffer circuit electrically coupled to and disposed between an output node of the oscillation circuit and the first buffer circuit, wherein the first buffer circuit has a drive capability higher than a drive capability of the third buffer circuit.

8. The circuit apparatus according to claim 6, wherein the first node is an input node of the second buffer circuit.

9. An oscillator comprising:

the circuit apparatus according to claim 4; and a resonator.

\* \* \* \* \*